(12) United States Patent
Hwang et al.

(10) Patent No.: US 11,342,221 B2
(45) Date of Patent: May 24, 2022

(54) SEMICONDUCTOR DEVICE

(71) Applicant: Samsung Electronics Co., Ltd., Suwon-si (KR)

(72) Inventors: Jaewon Hwang, Seongnam-si (KR); Jinnam Kim, Anyang-si (KR); Kwangjin Moon, Hwaseong-si (KR); Kunsang Park, Hwaseong-si (KR); Myungjoo Park, Pohang-sl (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 12 days.

(21) Appl. No.: 16/741,187

(22) Filed: Jan. 13, 2020

(65) Prior Publication Data

US 2021/0066123 A1 Mar. 4, 2021

(30) Foreign Application Priority Data

Sep. 4, 2019 (KR) .................. 10-2019-0109641

(51) Int. Cl.
*H01L 21/768* (2006.01)
*H01L 21/02* (2006.01)
*H01L 21/306* (2006.01)

(52) U.S. Cl.
CPC .. *H01L 21/76831* (2013.01); *H01L 21/02329* (2013.01); *H01L 21/30604* (2013.01); *H01L 21/76877* (2013.01)

(58) Field of Classification Search
CPC ............ H01L 25/0657; H01L 27/0688; H01L 21/76254; H01L 21/76831; H01L 21/8221
See application file for complete search history.

(56) References Cited

U.S. PATENT DOCUMENTS

| | | | |
|---|---|---|---|
| 6,153,935 A | 11/2000 | Edelstein et al. | |
| 6,551,919 B2 | 4/2003 | Venkatesan et al. | |
| 6,699,787 B2 * | 3/2004 | Mashino | H01L 24/05 438/667 |
| 7,259,091 B2 | 8/2007 | Schuehrer et al. | |
| 7,867,917 B2 | 1/2011 | Hohage et al. | |
| 8,338,939 B2 | 12/2012 | Lin et al. | |
| 8,541,820 B2 * | 9/2013 | Hayasaki | H01L 27/14683 257/225 |
| 9,076,664 B2 * | 7/2015 | Pelley | H01L 25/0657 |
| 9,343,390 B2 | 5/2016 | Lin et al. | |

(Continued)

*Primary Examiner* — Jaehwan Oh
*Assistant Examiner* — John M Parker
(74) *Attorney, Agent, or Firm* — Muir Patent Law, PLLC

(57) ABSTRACT

Aspects of the present disclosure are related to a semiconductor device that includes a crystalline substrate having a first surface and a second surface vertically opposite each other and an insulating layer disposed on the first surface of the crystalline substrate. The device may also include an etch stop layer interposed between and contacting the crystalline substrate and the insulating layer and a conductive through via structure penetrating the crystalline substrate and the insulating layer. The device may also include an insulating separation layer disposed horizontally adjacent to the conductive through via structure, and having an inner wall and an outer wall. The insulating separation layer may include a first portion disposed between the conductive through via structure and the crystalline substrate, and a second portion disposed between the conductive through via structure and the etch stop layer.

19 Claims, 26 Drawing Sheets

(56) References Cited

U.S. PATENT DOCUMENTS

| | | |
|---|---|---|
| 9,412,841 B2 | 8/2016 | Teo et al. |
| 9,685,369 B2 | 6/2017 | Liu et al. |
| 9,847,255 B2 | 12/2017 | Lin et al. |
| 2001/0011771 A1* | 8/2001 | Yoshida .................. H01L 22/32 257/734 |
| 2008/0217790 A1* | 9/2008 | Hasunuma ........ H01L 21/76816 257/774 |
| 2015/0102497 A1 | 4/2015 | Park et al. |
| 2015/0108605 A1 | 4/2015 | Park et al. |
| 2016/0351472 A1 | 12/2016 | Park et al. |
| 2019/0386051 A1* | 12/2019 | Hong ...................... H01L 24/13 |

* cited by examiner

SEMICONDUCTOR DEVICE

CROSS-REFERENCE TO RELATED APPLICATION

This application claims priority under 35 USC § 119 to Korean Patent Application No. 10-2019-0109641, filed on Sep. 4, 2019, in the Korean Intellectual Property Office (KIPO), the contents of which are incorporated by reference herein in their entirety.

BACKGROUND

1. Field

The inventive concepts relate to a semiconductor device and a method for manufacturing the same, and more particularly, to a semiconductor device including a through silicon via and a method for manufacturing the same.

2. Description of the Related Art

The semiconductor device may be electrically connected to another semiconductor device or a printed circuit board by a through via. Through vias can be used in three-dimensional chip mounting and may deliver faster transfer speeds than conventional solder balls or solder bumps. As semiconductor devices become highly integrated, there is a demand for the development of physically and electrically reliable through vias.

SUMMARY

There is provided a semiconductor device according to exemplary embodiments of the inventive concepts. An aspect of the present disclosure is related to a semiconductor device that includes a crystalline substrate having a first surface and a second surface vertically opposite each other. The device may also include an insulating layer disposed on the first surface of the crystalline substrate. The device may also include an etch stop layer interposed between and contacting the crystalline substrate and the insulating layer. The device may also include a conductive through via structure penetrating the crystalline substrate and the insulating layer. The device may also include an insulating separation layer disposed horizontally adjacent to the conductive through via structure, and having an inner wall and an outer wall opposite the inner wall, the inner wall contacting the conductive through via structure. The insulating separation layer may include a first portion disposed between the conductive through via structure and the crystalline substrate, and a second portion disposed between the conductive through via structure and the etch stop layer. The outer wall of the second portion may protrude from the outer wall of the first portion horizontally relative to the conductive through via structure.

An additional aspect of the present disclosure is related to a semiconductor device that includes a crystalline semiconductor substrate. The device may also include an etch stop layer disposed on a first surface of the crystalline semiconductor substrate. The device may also include a conductive through via structure penetrating the crystalline semiconductor substrate and the etch stop layer. The device may also include an insulating separation layer disposed between the conductive through via structure and the crystalline semiconductor substrate. A lower portion of the insulating separation layer may contact a portion of the etch stop layer.

An additional aspect of the present disclosure is related to a semiconductor device. The semiconductor device may also include a substrate. The device may also include a first semiconductor device disposed on the substrate. The device may also include a second semiconductor device disposed on the first semiconductor device. The device may also include where the first semiconductor device may include: a first crystalline semiconductor substrate, a first etch stop layer disposed on the first surface of the first crystalline semiconductor substrate. The device may also include a first conductive through via structure penetrating through the first crystalline semiconductor substrate and the first etch stop layer, and having a height of 10 m to 100 m; and a first insulating separation layer disposed between the first conductive through via structure and the first crystalline semiconductor substrate. A lower portion of the first insulating separation layer may contact a portion of the first etch stop layer.

BRIEF DESCRIPTION OF THE DRAWINGS

Some example embodiments of the inventive concepts will be more clearly understood from the following detailed description taken in conjunction with the accompanying drawings in which.

DESCRIPTION OF EMBODIMENTS

Figure 1:
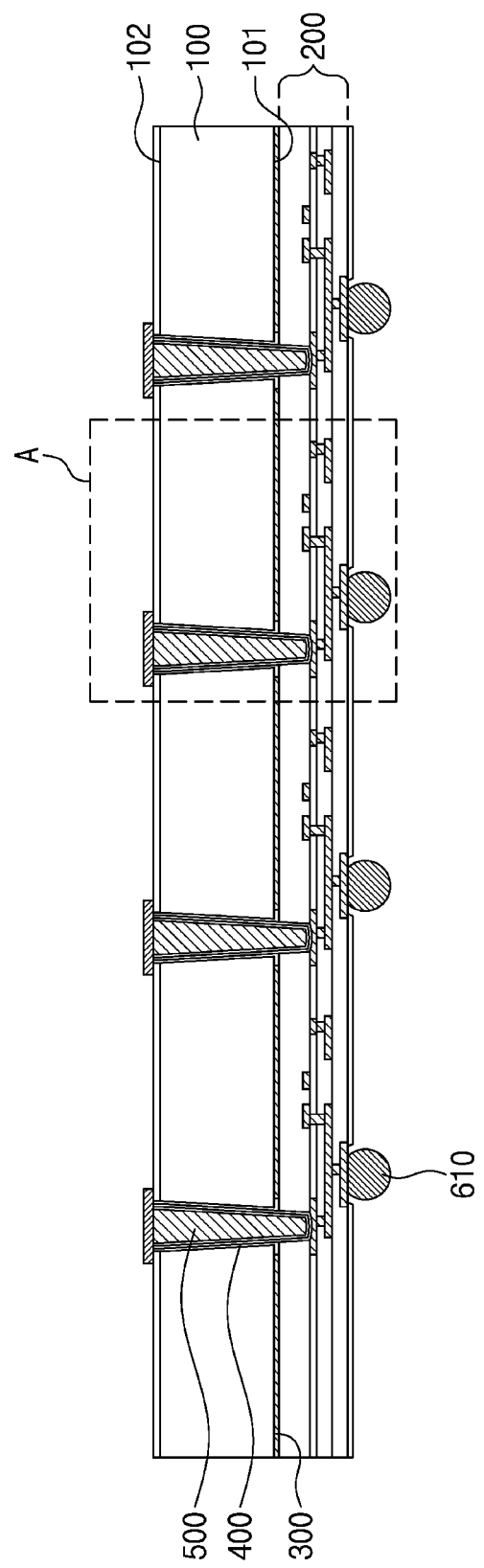
FIG. 1 is a cross-sectional view illustrating a semiconductor device in accordance with example embodiments.

Hereinafter, some embodiments of the inventive concepts will be described in detail with reference to the accompanying drawings. The same reference numerals are used for the same constituent elements in the drawings, and duplicate description thereof will be omitted.

FIG. 1 is a cross-sectional view illustrating a semiconductor device in accordance with example embodiments.

Referring to FIG. 1, a semiconductor device may include a semiconductor substrate 100, a wiring layer 200, an etch stop layer 300, a separating layer 400, and a through via structure 500. The semiconductor device may be a semiconductor chip including a memory chip, a logic chip, or a combination thereof. The semiconductor substrate 100 may be a wafer level or chip level substrate. The semiconductor substrate 100 may be a crystalline semiconductor substrate. For example, the semiconductor substrate 100 may be in a single crystal state. The semiconductor substrate 100 may be formed of silicon, germanium, or silicon-germanium. The semiconductor substrate 100 may have a first surface 101 and a second surface 102 opposite each other. The first surface 101 of the semiconductor substrate 100 may be a front surface, and the second surface 102 may be a rear surface. The second surface 102 of the semiconductor substrate 100 may be parallel to the first surface 101.

The etch stop layer 300 and the wiring layer 200 may be provided on the first surface 101 of the semiconductor substrate 100, i.e., layers 200, 300 may be provided vertically beneath first surface 101 and/or be in contact with first surface 101. It shall be understood that the term "on," as used throughout this disclosure, is to be construed broadly with a meaning understood from the context and exemplary illustrations of this disclosure, e.g., "on" shall encompass a meaning of "on" something from above and "on" something from below and does not require the designated items to be directly adjacent to each other. The etch stop layer 300 may be interposed between the semiconductor substrate 100 and the wiring layer 200. As another example, the wiring layer 200 may include a plurality of insulating layers, and the etch stop layer 300 may be interposed between the insulating layers.

The through via structure 500 may be formed in the semiconductor substrate 100, and may penetrate at least a portion of the wiring layer 200 and the etch stop layer 300. The through via structure 500 may be a conductive through via structure. The separating layer 400 may be interposed between the through via structure 500 and the semiconductor substrate 100. The separating layer 400 may be an insulating separation layer. The connection terminal 610 may be provided on the bottom surface of the wiring layer 200. The connection terminal 610 may include a solder ball. The connection terminal 610 may include a conductive material, for example, metal. The connection terminal 610 may include, for example, tin, silver, bismuth, and/or alloys thereof. The connection terminal 610 may be electrically connected to the through via structure 500. In this disclosure, "electrically connected/contact" may mean direct connection/contact or indirect connection/contact via other conductive components. However, the term "contact," "in contact with," or "contacting," used in the physical sense refers to a direct connection (e.g., touching). The through via structure 500 and the connection terminal 610 may transmit electrical signals to or from a semiconductor device. In the present disclosure, an electrical connection with the semiconductor device may mean an electrical connection with at least one of the integrated circuits of the semiconductor device. Hereinafter, the semiconductor device according to the example embodiments will be described in more detail.

Figure 2A:
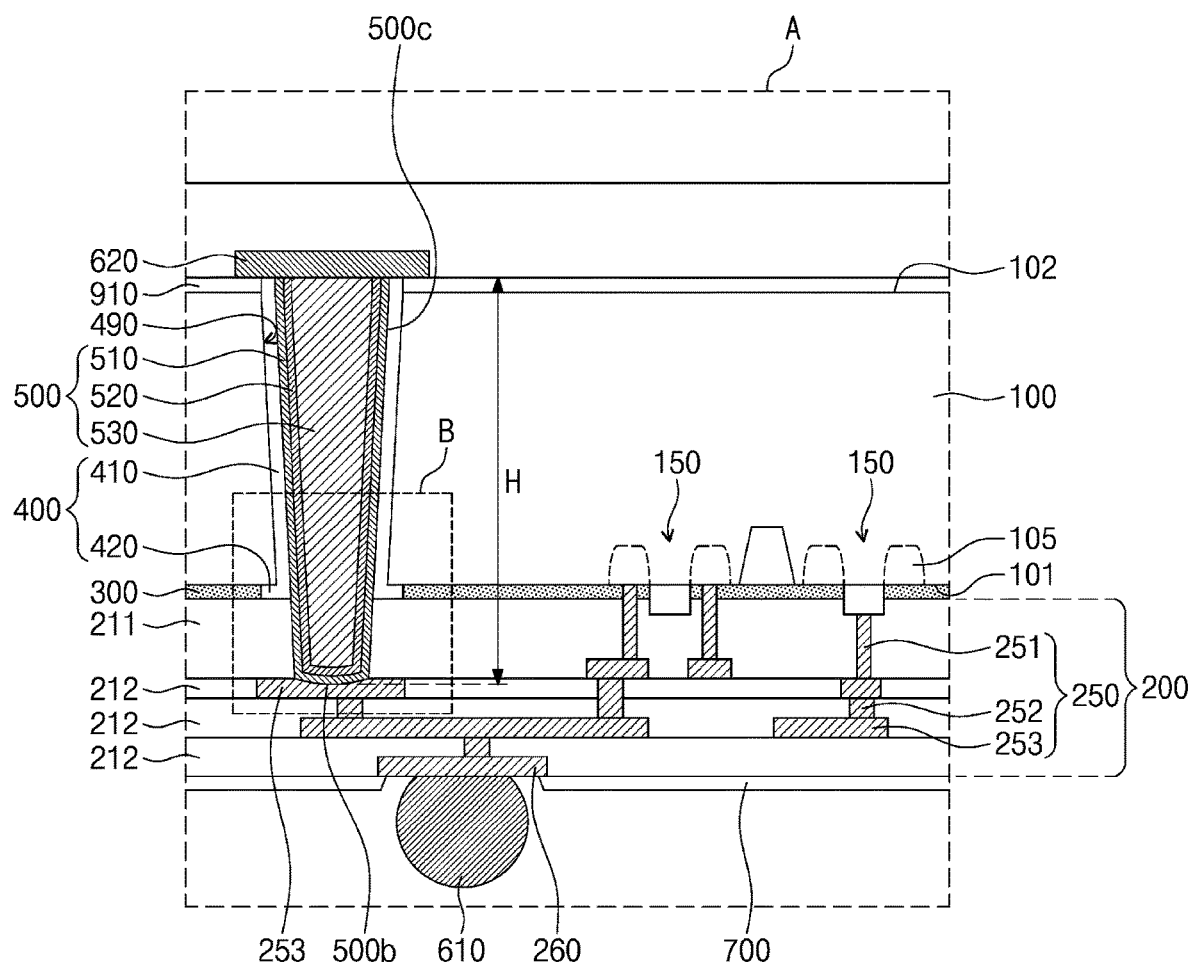
FIG. 2A is a cross-sectional view illustrating a semiconductor device in accordance with example embodiments.
Figure 2B:
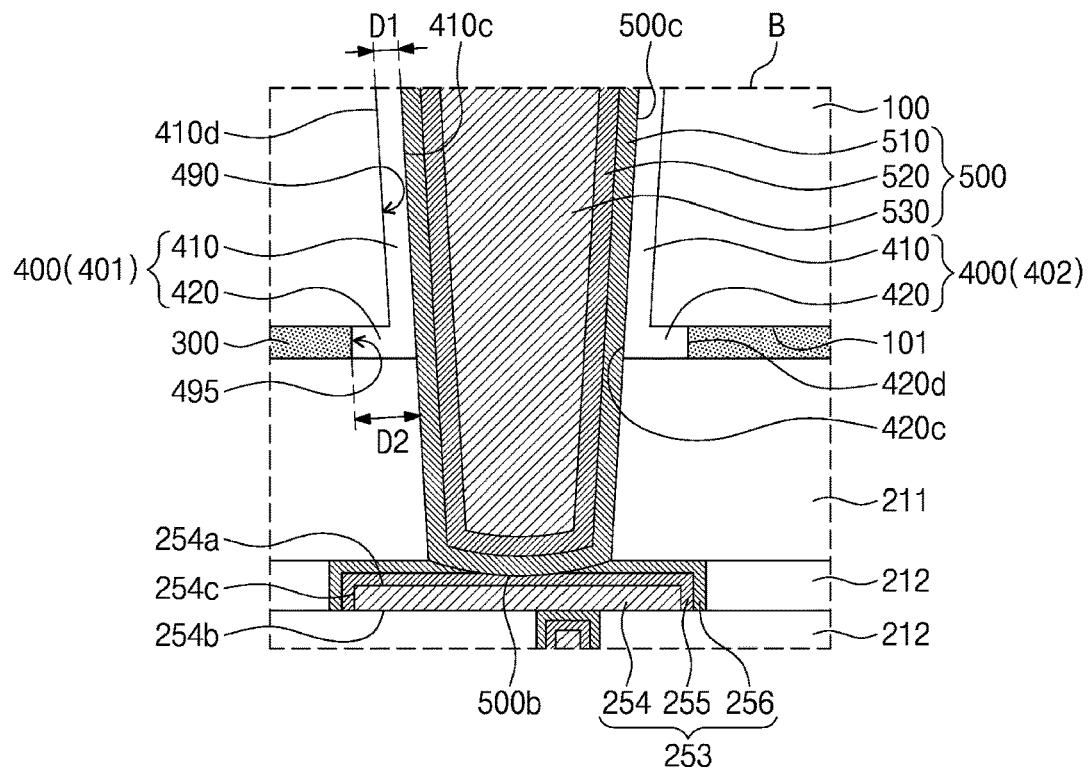
FIG. 2B is an enlarged view of region B of FIG. 2A.
Figure 2C:
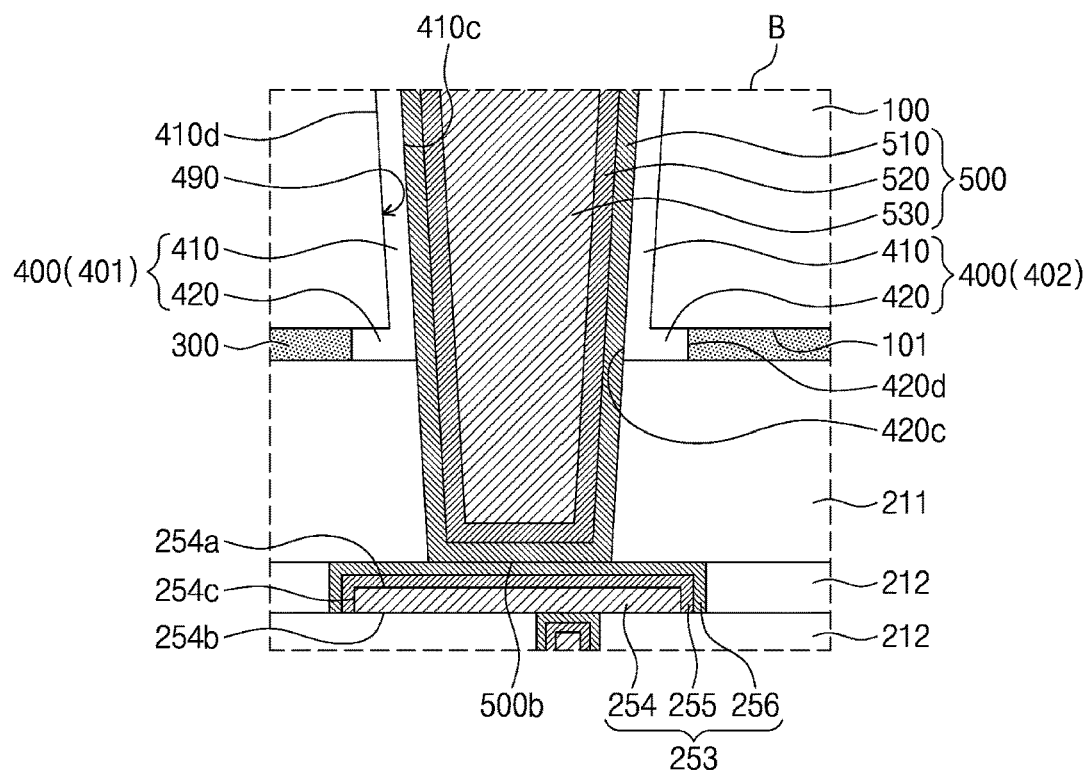
FIG. 2C is a cross-sectional view illustrating a through via structure and a wiring pattern in accordance with example embodiments.

FIG. 2A is a cross-sectional view illustrating a semiconductor device in accordance with example embodiments, and is an enlarged view of region A of FIG. 1. FIG. 2B is an enlarged view of region B of FIG. 2A. FIG. 2C is cross-sectional view for describing a through via structure and a wiring pattern according to example embodiments, and corresponds to an enlarged view of region B of FIG. 2A. Hereinafter, descriptions repeating explanations described above will be omitted.

Referring to FIGS. 1, 2A, and 2B, a semiconductor device includes a crystalline semiconductor substrate 100, integrated circuits 150, a wiring layer 200, an etch stop layer 300, a separating layer 400, and a through via structure 500. The wiring layer 200 is disposed on the first surface 101 of the semiconductor substrate 100. For example, wiring layer 200 may be disposed underneath the first surface 101. Wiring layer 200 may also be disposed between first surface 101 and connection terminal 610 in a vertical direction. The wiring layer 200 may include a first insulating layer 211, a second insulating layer 212, and a wiring structure 250. Integrated circuits 150 may be provided in the semiconductor substrate 100 or on the first surface 101 of the semiconductor substrate 100. Integrated circuits 150 may include transistors, for example. Integrated circuits 150 may include a doped region 105, which may function as a source/drain region of a transistor. The first insulating layer 211 may cover the etch stop layer 300 and the integrated circuits 150. The first insulating layer 211 may be in contact with and/or disposed on a bottom surface of the first surface 101. The first insulating layer 211 may include a semiconductor oxide such as silicon oxide, silicon nitride oxide, or silicon carbide oxide. The first insulating layer 211 may be amorphous. The first insulating layer 211 may be multiple layers. The second insulating layer 212 may be provided on the bottom surface of the first insulating layer 211. The second insulating layer 212 may include a plurality of stacked second insulating layers 212. The second insulating layer(s) 212 may be amorphous. The second insulating layer(s) 212 may include a semiconductor oxide such as silicon oxide, silicon nitride oxide, or silicon carbide oxide.

The wiring structure 250 is disposed on the first surface 101 of the semiconductor substrate 100, and may be provided in the first and second insulating layers 211 and 212 or between the insulating layers 211 and 212. For example, a portion of wiring structure 250 may be disposed beneath the first surface 101 and be contact with first surface 101. The wiring structure 250 may include contact plugs 251, metal vias 252, and wiring patterns 253. The wiring structure 250 may include a conductive material, for example, copper or tungsten. The contact plugs 251 pass through the first insulating layer 211 and may be connected to the integrated circuits 150. The wiring pattern 253 may be provided between the insulating layers 211 and 212. At least one of the wiring patterns 253 may be electrically connected to the contact plug 251. The metal via 252 passes through at least one of the second insulating layers 212 and may be connected to a corresponding one of the wiring patterns 253.

An etch stop layer 300 is provided on the first surface 101 of the semiconductor substrate 100. The etch stop layer 300 may be in physical contact with the first surface 101 of the semiconductor substrate 100. The etch stop layer 300 may be provided between any one of the wiring patterns 253 and the semiconductor substrate 100. The etch stop layer 300 may be interposed between the semiconductor substrate 100 and the first insulating layer 211. The etch stop layer 300 may include a material different from the semiconductor substrate 100 and the first insulating layer 211. The etch stop layer 300 may include a material having an etch selectivity with respect to the semiconductor substrate 100 and the first insulating layer 211. The etch stop layer 300 may include aluminum (Al), silicon (Si), carbon (C), oxygen (O), nitrogen (N), and/or hydrogen (H). For example, the etch stop layer 300 may include silicon nitride (SiNx), silicon carbide nitride (SiCxNy), and/or aluminum oxide (AlOx), where x and y are each independently a positive real number.

The through via structure 500 is provided in the semiconductor substrate 100, the etch stop layer 300, and the first insulating layer 211. For example, the through hole 490 penetrates the semiconductor substrate 100, the etch stop layer 300, and the first insulating layer 211, and the through via structure 500 is provided in the through hole 490. The through via structure 500 may be connected to the wiring structure 250. For example, the through via structure 500 may contact one of the wiring patterns 253. The height H of the through via structure 500 may be relatively much greater than the heights of the metal vias 252 and the heights of the contact plugs 251. For example, the height H of the through via structure 500 may be about 10 μm to about 100 μm.

The through via structure 500 may include a barrier pattern 510, a seed pattern 520, and a conductive via 530. The barrier pattern 510 may be provided along the sidewall 500c and the bottom surface 500b of the through via structure 500. The barrier pattern 510 may be formed between the conductive via 530 and the substrate 100, between the conductive via 530 and the etch stop layer 300, between the conductive via 530 and the first insulating layer 211, and between the conductive via 530 and one of the wiring patterns 253. It may be interposed between the conductive via 530 and any one of the wiring patterns 253. The barrier pattern 510 may include at least one of titanium (Ti), titanium nitride (TiN), tantalum (Ta), tantalum nitride (TaN), ruthenium, cobalt, and alloys thereof.

The seed pattern 520 may extend along the barrier pattern 510 on the barrier pattern 510. The seed pattern 520 may be interposed between the barrier pattern 510 and the conductive via 530. The seed pattern 520 may include a conductive material such as metal. The seed pattern 520 may include, for example, copper, tungsten, manganese, titanium, or an alloy thereof.

The conductive via 530 is provided on the seed pattern 520 and fills the through hole 490. The conductive via 530 may include a metal such as copper or tungsten. The top surface of the conductive via 530 may be disposed at substantially the same level as the top surface of the seed pattern 520, the top surface of the barrier pattern 510, and the top surface of the separating layer 400. It shall be appreciated that terms described as "substantially the same," "substantially equal," and "substantially planar," may be exactly the same, equal, planar, or at the same level or they may be the same, equal, planar, or at the same level within acceptable variations that may occur, for example, due to manufacturing processes.

As shown in FIGS. 2B and 2C, the wiring pattern 253 may include a barrier metal film 256, a seed metal film 255, and a metal pattern 254. The metal pattern 254 may have a first surface 254a and a second surface 254b opposite each other, for example, an upper surface and a lower surface. The first surface 254a of the metal pattern 254 may face the first surface 101 of the semiconductor substrate 100. The metal pattern 254 may include copper or tungsten. The barrier metal film 256 and the seed metal film 255 may be interposed between the metal pattern 254 and the first insulating layer 211. For example, a barrier metal film 256 may be interposed between the first surface 254a of the metal pattern 254 and the first insulating layer 211, and between the metal pattern 254 and the through via structure 500. The through via structure 500 may physically contact the barrier metal film 256. For example, the barrier pattern 510 (barrier layer) may physically contact the barrier metal film 256. The barrier metal film 256 may further extend on the side surface 254c of the metal pattern 254 to be interposed between the metal pattern 254 and the corresponding one of the second insulating layers 212. The barrier metal film 256 may include, for example, at least one of titanium (Ti), titanium nitride (TiN), tantalum (Ta), and tantalum nitride (TaN). The seed metal film 255 may be provided between the metal pattern 254 and the barrier metal film 256. In one embodiment, the seed metal film 255 covers the first surface 254a (uppermost surface) and the side surface 254c of the metal pattern 254, and does not cover the second surface 254b (lowermost surface) of the metal pattern 254. The seed metal film 255 may include, for example, copper, manganese, titanium, or an alloy thereof.

As shown in FIG. 2B, the bottom surface 500b of the through via structure 500 may be rounded or chamfered. The bottom surface 500b of the through via structure 500 may correspond to the bottom surface of the barrier pattern 510 (barrier layer). The bottom surface 500b of the through via structure 500 may be convex downward. The bottom surface 500b of the through via structure 500 may have a center portion and an edge portion. The edge portion may be interposed between the center portion and the sidewall 500c of the through via structure 500 in a plan view. The center portion may be disposed at a lower level than the edge portion. As the bottom surface 500b of the through via structure 500 is rounded, a contact area between the through via structure 500 and the wiring pattern 253 may increase. Accordingly, the through via structure 500 and the wiring pattern 253 may be electrically connected. For example, the through via structure 500 may further extend into the seed metal film 255 so that the barrier pattern 510 contacts the seed metal film 255. As another example, the bottom surface 500b of the through via structure 500 may be provided in the barrier pattern 510, and the through via structure 500 may not extend all the way to contact the seed metal film 255.

As shown in FIG. 2C, the bottom surface 500b of the through via structure 500 may be substantially flat, smooth, or planar. The center portion of the bottom surface 500b of the through via structure 500 may be disposed at substantially the same level as the edge portion of the bottom surface 500b. As shown in this embodiment, the through via structure 500 contacts the barrier metal film 256, and does not contact the seed metal film 255 or the metal pattern 254.

As illustrated in FIG. 2A, the wiring pattern 253 may include a plurality of wiring patterns 253. For simplicity, the metal pattern 254, the seed metal film 255, and the barrier metal film 256 are illustrated in detail in FIGS. 2B, 2C, 3B, 3G, 4C, 4E, and 5B. However, each of the wiring patterns 253 may include a metal pattern 254, a seed metal film 255, and a barrier metal film 256 as illustrated in FIGS. 2B and 2C. In each of the wiring patterns 253, the barrier metal film 256 may be disposed on the first surface 254a of the metal pattern 254. For simplicity, a singular wiring pattern 253, the barrier metal film 256, and the seed metal film 255 will be described below.

The separating layer 400 may surround the sidewall 500c of the through via structure 500. The separating layer 400 may be disposed adjacent to the through via structure 500. The separating layer 400 disposed adjacent to the through via structure 500 may be in physical contact with the through via structure 500. The separating layer 400 may include a first portion 410 and a second portion 420. The first portion 410 may be provided between the through via structure 500 and the semiconductor substrate 100. The second portion 420 may be interposed between the through via structure 500 and the etch stop layer 300. The second portion 420 may be disposed between the through via structure 500 and the first etch stop layer, be electrically connected to the first portion 410, and may protrude toward a side surface of the first etch stop layer. The second portion 420 of the separating layer 400 may include the same material as the first portion 410 and may be connected without any interface. As illustrated in FIG. 2B, the separating layer 400 may have a second portion 420 interposed between the first surface 101 and the first insulating layer 211. The separating layer 400 may not be provided in the first insulating layer 211. For example, the bottom surface of the separating layer 400 may be disposed at substantially the same level as the bottom surface of the etch stop layer 300.

The separating layer 400 may have an inner wall facing the through via structure 500 and an outer wall opposite the inner wall. As illustrated in FIG. 2B, the inner wall of the separating layer 400 may include a first inner wall 410c of the first portion 410 and a second inner wall 420c of the second portion 420. The outer wall of the separating layer 400 may include a first outer wall 410d of the first portion 410 and a second outer wall 420d of the second portion 420. The first inner wall 410c and the second inner wall 420c of the separating layer 400 may be in physical contact with the barrier pattern 510. The second inner wall 420c of the separating layer 400 may be connected to the first inner wall 410c. The second outer wall 420d of the second portion 420 of the separating layer 400 may not be aligned with the first outer wall 410d of the first portion 410. The second portion 420 of the separating layer 400 may protrude toward the etch stop layer 300. For example, the second outer wall 420d may protrude laterally outward with respect to the first outer wall 410d of the first portion 410. The second gap D2 between the second outer wall 420d and the sidewall 500c may be greater than the first gap D1 between the first outer wall 410d and the sidewall 500c of the through via structure 500. The separating layer 400 may contact a portion of the etch stop layer 300. For example, a lower portion of the separating layer 400 may contact a portion of the etch stop layer 300, and a lower portion of the separating layer 400 may correspond to the second portion 420.

The through via structure 500 may include a first sidewall and a second sidewall opposite the first sidewall. As illustrated in FIG. 2B, the separating layer 400 may include a first insulating separation pattern 401 and a second insulating separation pattern 402 facing the first insulating separation pattern 401. The first insulating separation pattern 401 (also described as a first insulating isolation pattern) may be disposed on the first sidewall of the through via structure 500. The second insulating separation pattern 402 (also described as a second insulating isolation pattern) may be disposed on the second sidewall of the through via structure 500. Each of the first insulating separation pattern 401 and the second insulating separation pattern 402 may include a first portion 410 and a second portion 420.

The separating layer 400 may electrically separate the semiconductor substrate 100 and the through via structure 500. The leakage current of the through via structure 500 may be prevented and/or suppressed by the separating layer 400. The separating layer 400 may include an insulating material such as silicon oxide or silicon oxynitride.

The through via structure 500 may be spaced apart from the integrated circuits 150 by a predetermined distance. For example, the through via structure 500 may be horizontally spaced apart from the doped region 105. In the present disclosure, "horizontal" may mean a direction that is parallel to the first surface 101 of the semiconductor substrate 100.

Figure 4A:
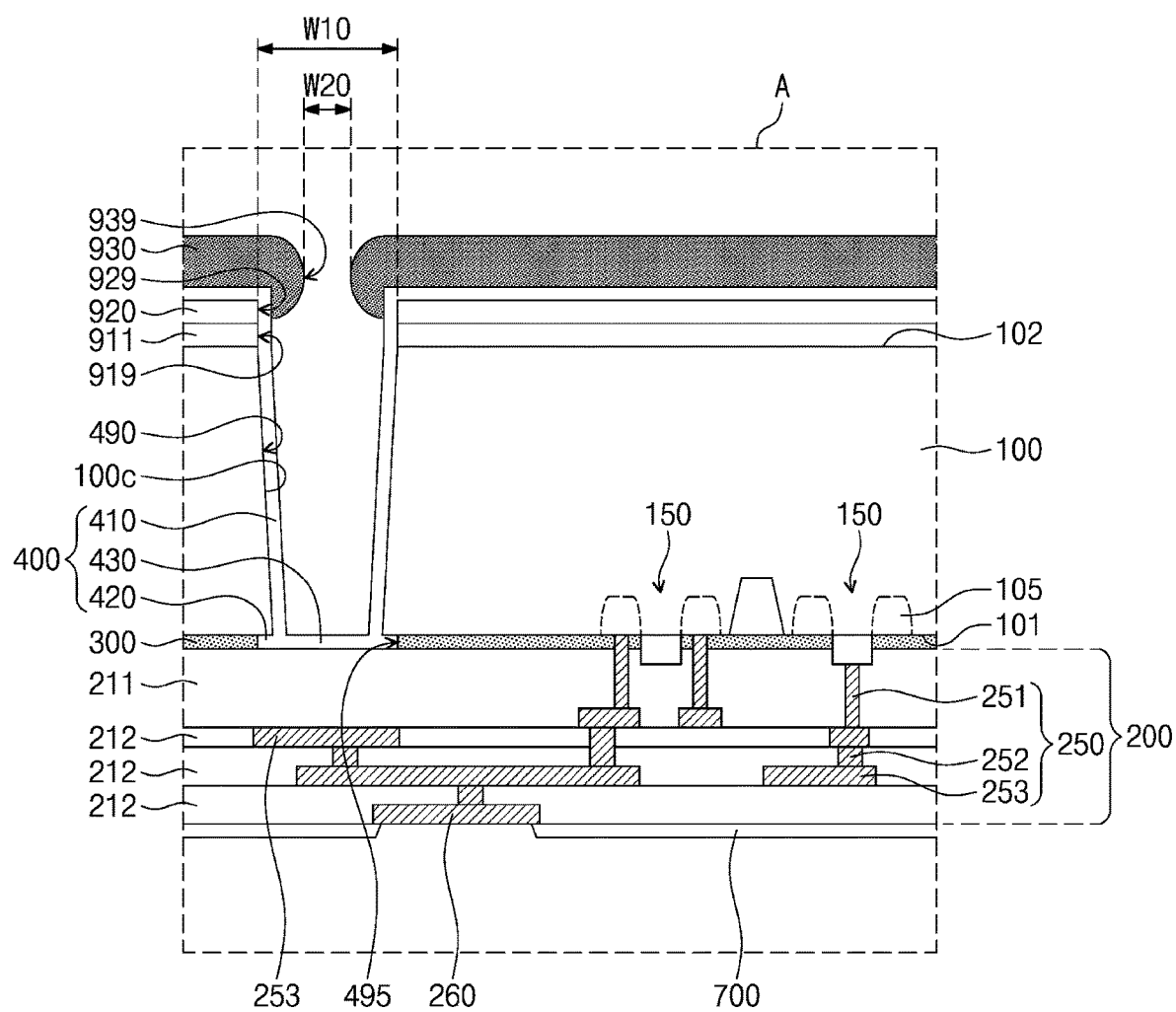
FIGS. 4A, 4B, and 4D are cross-sectional views for describing a method of manufacturing a semiconductor device in accordance with example embodiments.
Figure 4B:
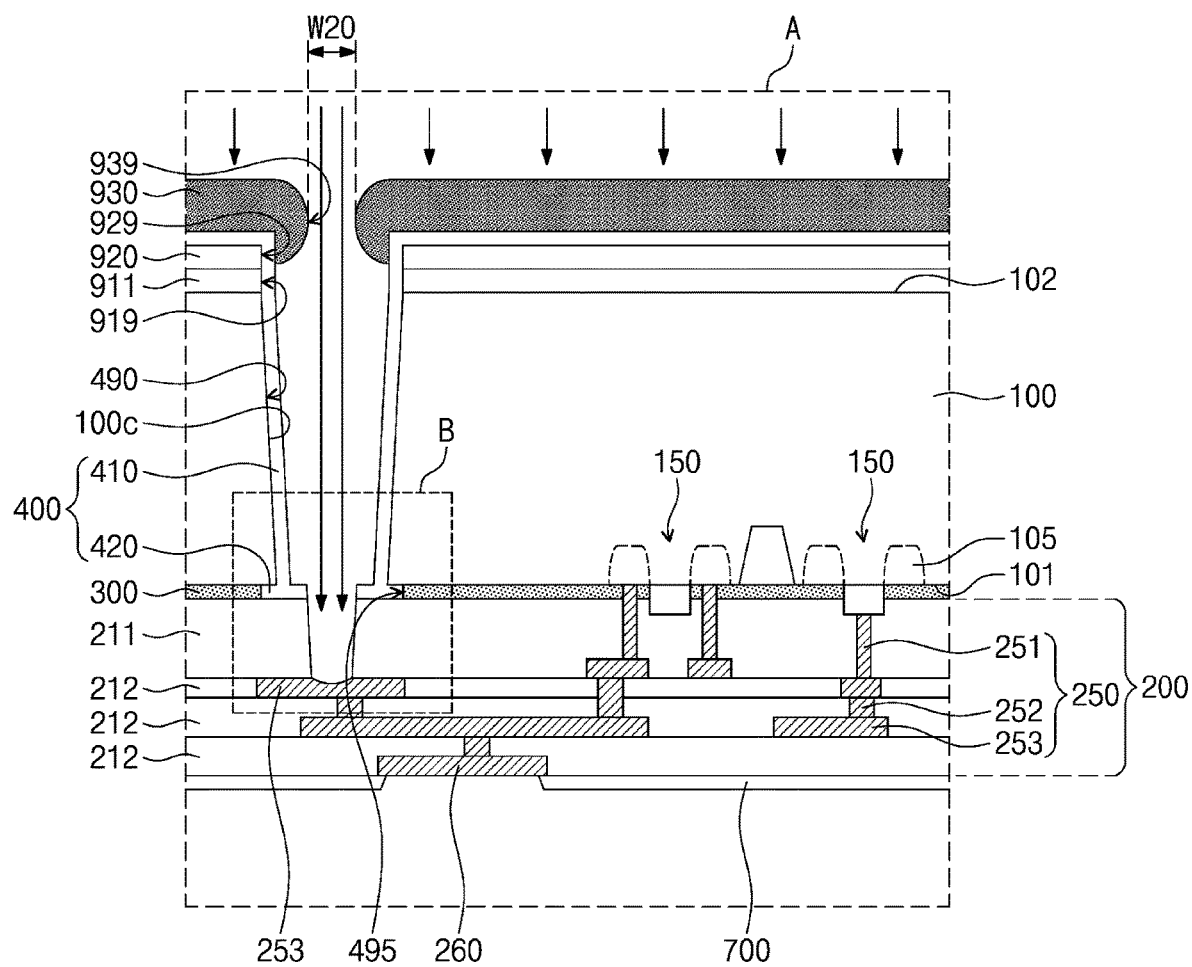
Figure 4C:
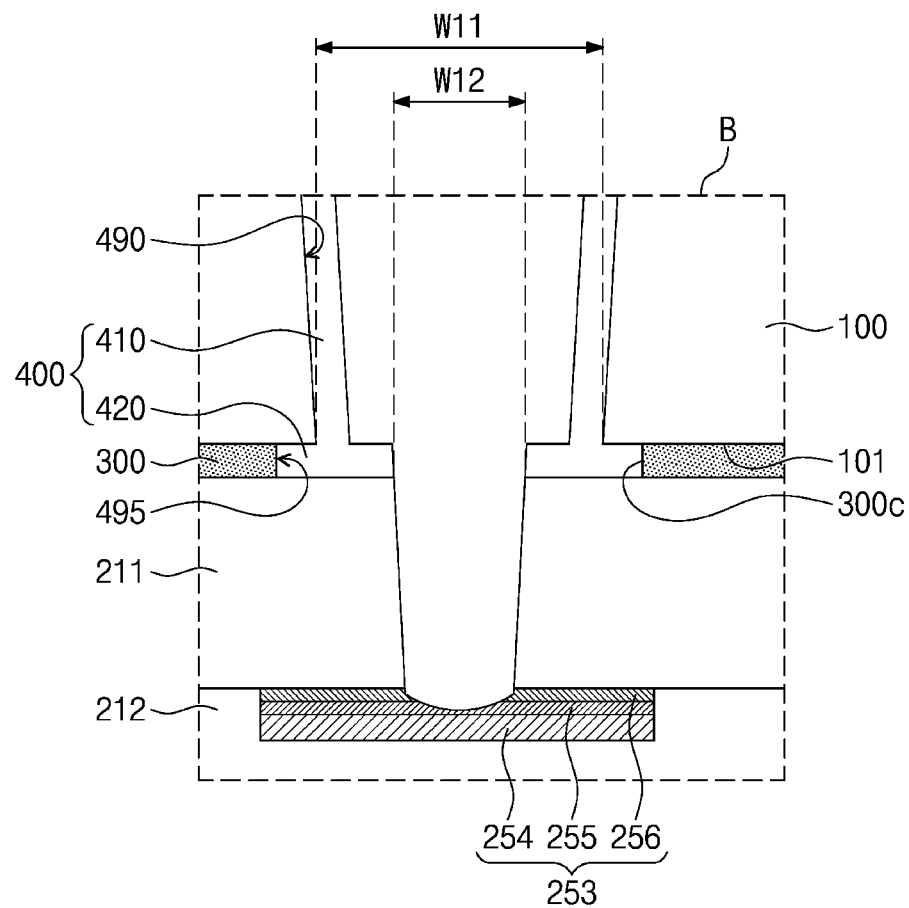
FIG. 4C is an enlarged view of region B of FIG. 4B.
Figure 4D:
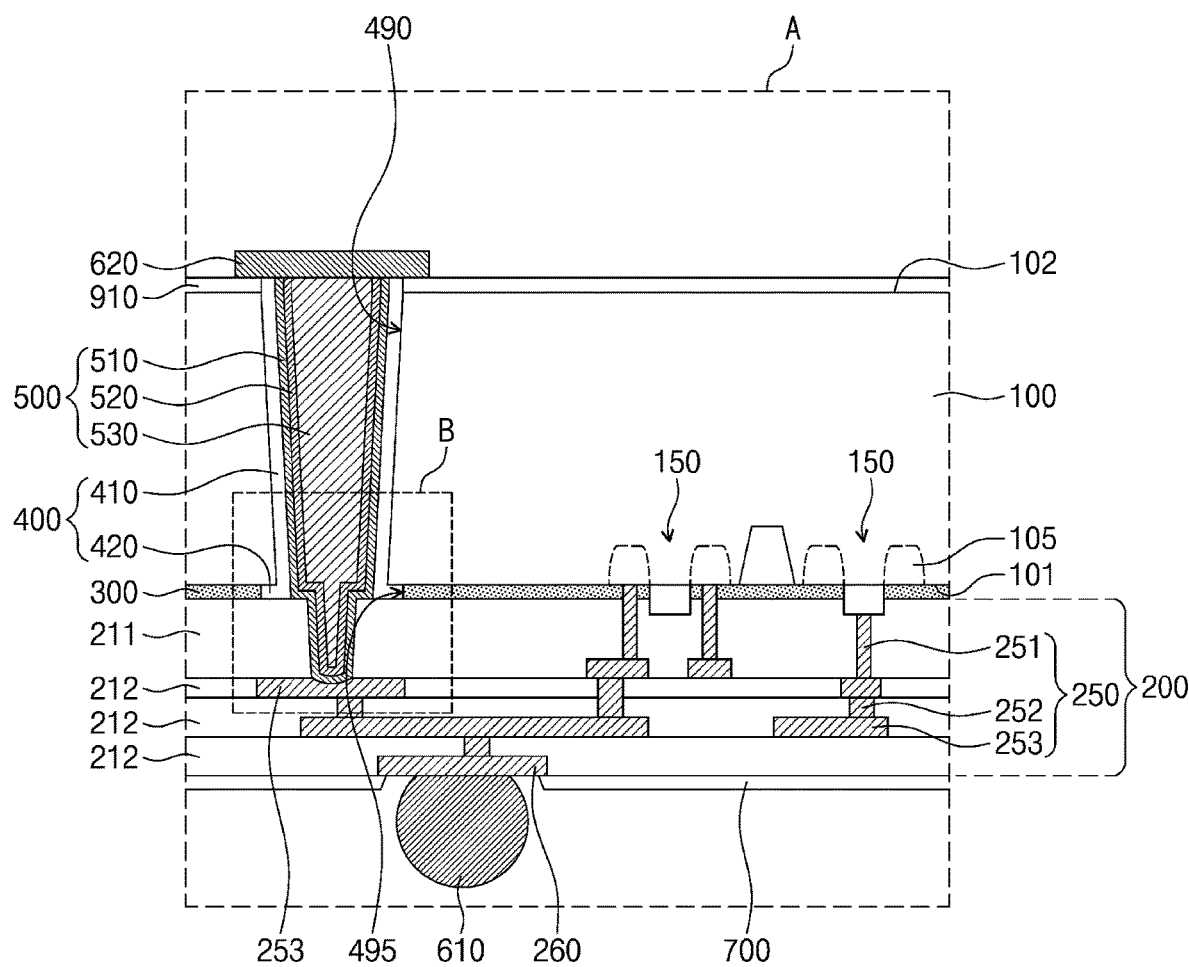

As shown in FIG. 4D, a third insulating layer 910 may be further provided on the second surface 102 of the semiconductor substrate 100 to cover the second surface 102 of the semiconductor substrate 100. The through via structure 500 may be provided in the third insulating layer 910. The third insulating layer 910 may expose the top surface of the through via structure 500. The third insulating layer 910 may include a carbon-containing material such as a spin on carbon hard mask (SOC) material. The carbon containing material may be amorphous. As another example, the third insulating layer 910 may be omitted.

As shown in FIG. 4D a conductive pad 620 may be provided on the second surface 102 of the semiconductor substrate 100, and may cover the top surface of the through via structure 500 and the top surface of the third insulating layer 910. The conductive pad 620 may be electrically connected to the through via structure 500. The conductive pad 620 may be electrically connected to the integrated circuits 150 by the through via structure 500 and the wiring structure 250. The conductive pad 620 may function as a terminal electrically connected to an external device. The external device may be, for example, a semiconductor chip, a passive device, a substrate, or a board. The conductive pad 620 may include metals such as copper, aluminum, titanium, and/or alloys thereof.

A terminal pad 260 may be disposed on the bottom surface of the wiring layer 200. The terminal pad 260 may be electrically connected to the integrated circuits 150 or the through via structure 500 by the wiring structure 250. The terminal pad 260 may include a metal material such as copper, titanium, or aluminum. The connection terminal 610 may be further provided on the terminal pad 260. The connection terminal 610 may be electrically connected to the terminal pad 260.

A protective layer 700 may be further provided on the bottom surface of the wiring layer 200. The protective layer 700 may have a terminal opening that exposes the terminal pad 260. The protective layer 700 may include an insulating material, for example, an insulating polymer.

Figure 3A:
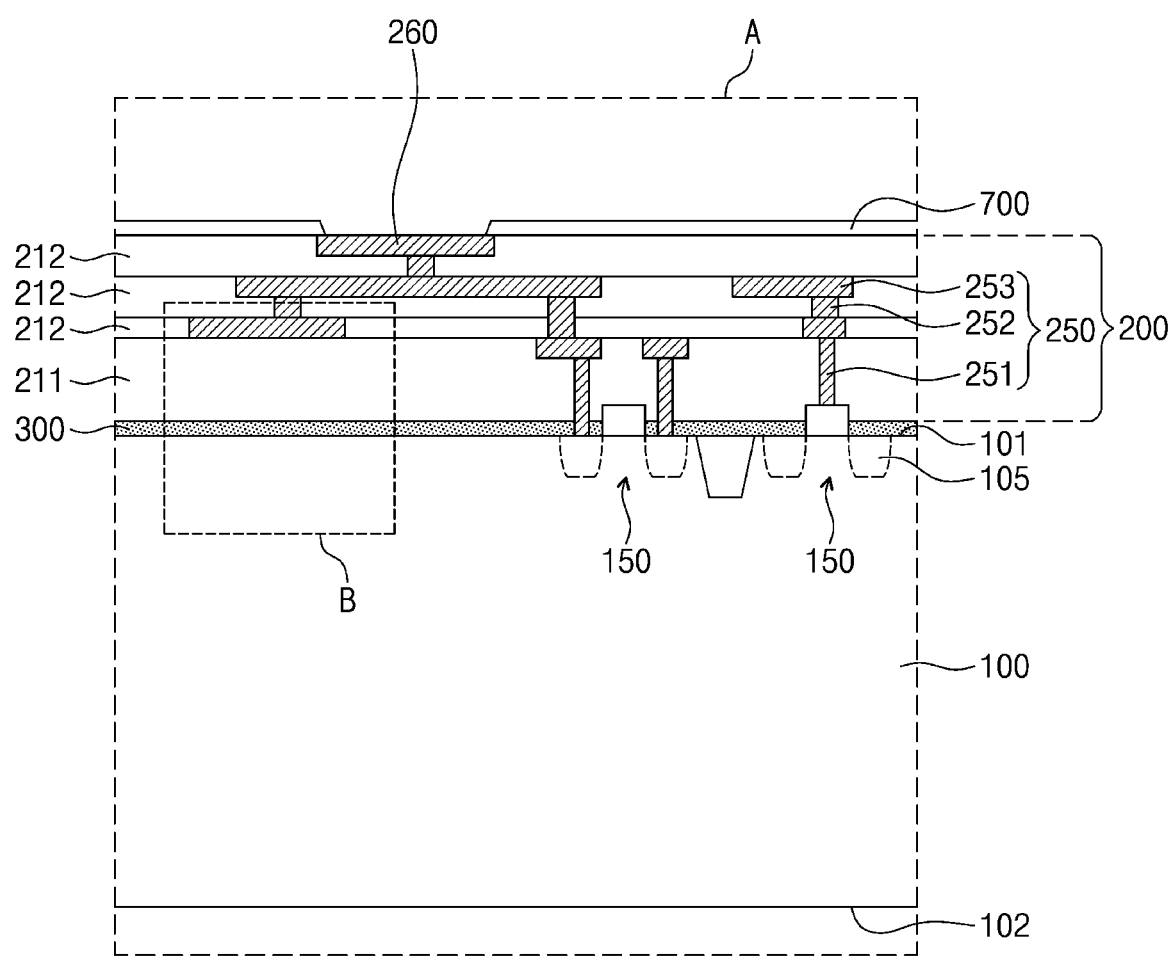
FIGS. 3A, 3C, 3D, 3E, 3F, 3H, 3I, and 3J are cross-sectional views for describing a method of manufacturing a semiconductor device in accordance with example embodiments.
Figure 3B:
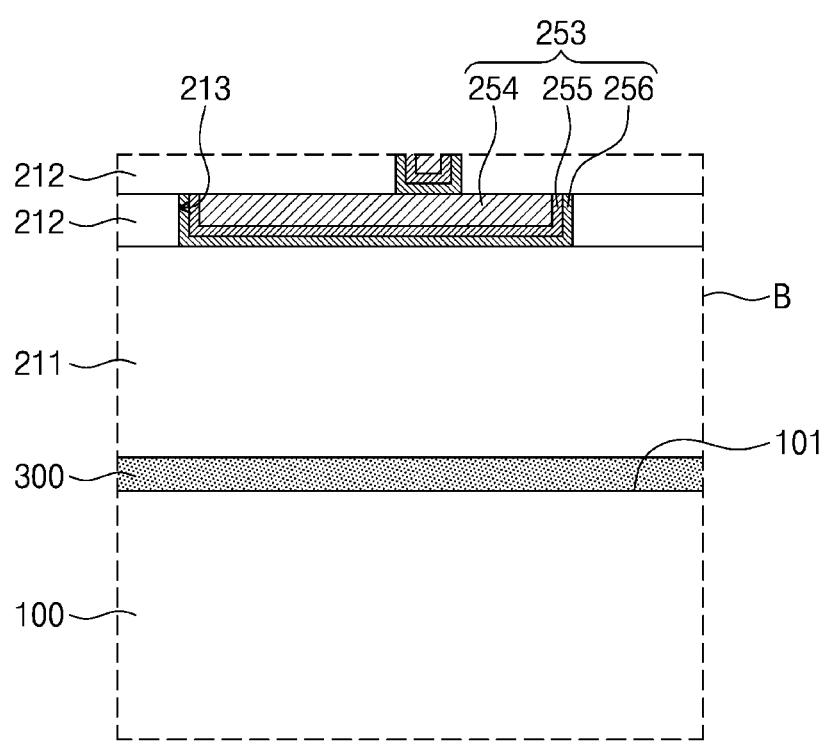
FIG. 3B is an enlarged view of region B of FIG. 3A.

FIGS. 3A, 3C, 3D, 3E, 3F, 3H, 3I, and 3J are cross-sectional views for describing a method of manufacturing a semiconductor device according to example embodiments. FIG. 3B is an enlarged view of region B of FIG. 3A. FIG. 3G is an enlarged view of region B of FIG. 3F. Hereinafter, descriptions repeating explanations described above will be omitted. In describing FIG. 3A, the top surface, the bottom surface, the lowermost portion, and the uppermost portion are described with reference to FIG. 3A, and the top surface, the bottom surface, the lowermost portion, and the uppermost portion described in FIG. 3A may be oriented differently than the top surface, the bottom surface, the lowermost portion, and the uppermost portion shown in FIGS. 2A to 2B and FIGS. 3C to 3J. For example, FIG. 3A illustrates wiring layer 200 as being on top of first surface 101 in the vertical direction whereas FIG. 2A illustrates wiring layer 200 as being on the bottom of first surface 101 in the vertical direction.

Referring to FIGS. 3A and 3B, an etch stop layer 300 and a wiring layer 200 are formed on the first surface 101 (upper surface) of the semiconductor substrate 100. In example embodiments, a semiconductor substrate 100 having a crystalline structure is prepared. A doped region 105 may be formed by implanting a conductive impurity on the first surface 101 of the semiconductor substrate 100. Integrated circuits 150 may be formed on the first surface 101 of the semiconductor substrate 100 or in the semiconductor substrate 100. Forming integrated circuits 150 may include forming doped region 105.

An etch stop layer 300 is formed on the first surface 101 of the semiconductor substrate 100 to cover the first surface 101 of the semiconductor substrate 100. The etch stop layer 300 may be in physical contact with the first surface 101 of the semiconductor substrate 100.

The first insulating layer 211 is formed on the etch stop layer 300 to cover the integrated circuits 150. The first insulating layer 211 may include a plurality of insulating layers. The contact plug 251 may pass through the first insulating layer 211 and may be connected to the integrated circuits 150. The contact plug 251 may further pass through the etch stop layer 300. The second insulating layer 212 may be formed on the first insulating layer 211.

As illustrated in FIG. 3B, a trench 213 may be formed in the second insulating layer 212 to expose the first insulating layer 211. A barrier metal film 256 may be formed in the trench 213 to conformally cover the bottom and sidewalls of the trench 213. The seed metal film 255 may be formed on the barrier metal film 256. By performing an electroplating process using the seed metal film 255 (e.g., a seed metal layer) as an electrode, a metal pattern 254 may be formed on the seed metal film 255 (seed metal layer). Thereafter, a patterning process of the barrier metal film 256, the seed metal film 255, and the metal pattern 254 may be further performed. The patterning process may include removing the barrier metal film 256, the seed metal film 255, and the metal pattern 254 on the top surface of the second insulating layer 212. Accordingly, the barrier metal film 256, the seed metal film 255, and the metal pattern 254 may be disposed in the trench 213. Accordingly, forming the wiring pattern 253 can be completed.

The formation of the second insulating layer 212 and the formation of the wiring pattern 253 may be repeatedly performed. Accordingly, a plurality of stacked second insulating layers 212 may be formed as shown in FIG. 3A, and wiring patterns 253 may be formed between the second insulating layers 212. Although not shown in FIG. 3A, each of the wiring patterns 253 may include a barrier metal film 256, a seed metal film 255, and a metal pattern 254. In each of the wiring patterns 253, the barrier metal film 256 may be interposed between the semiconductor substrate 100 and the metal pattern 254. Metal vias 252 may be formed to penetrate at least one of the second insulating layers 212. The wiring patterns 253 and the metal vias 252 may be formed by, for example, a damascene process, but are not limited thereto. Hereinafter, the single wiring pattern 253 will be described.

The terminal pad 260 may be formed on the uppermost second insulating layer 212 to connect with the wiring structure 250. The protective layer 700 may be further formed on the wiring layer 200. The protective layer 700 may expose at least a portion of the terminal pad 260.

Figure 3C:
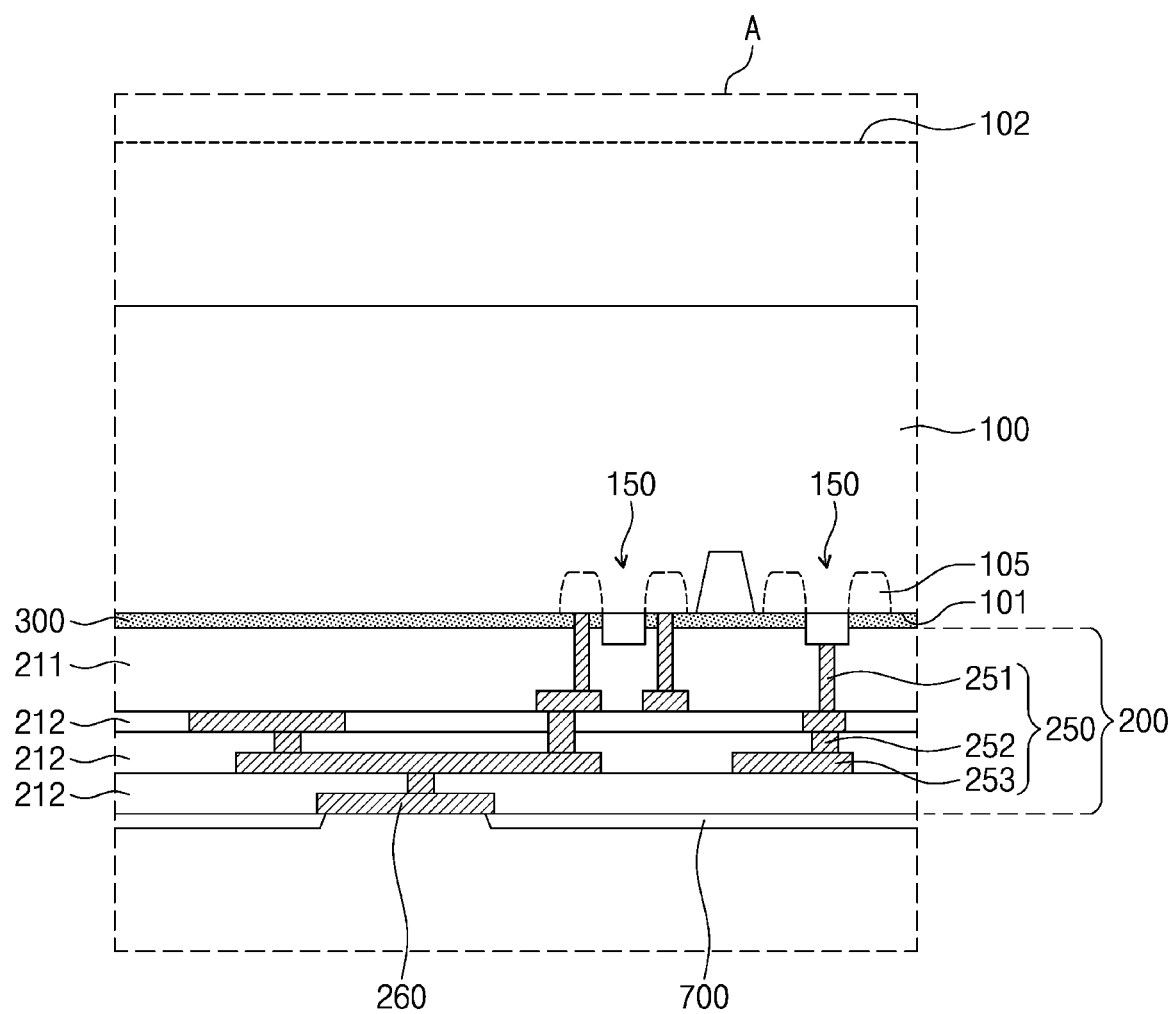

Referring to FIG. 3C, the semiconductor substrate 100 is turned upside down so that the second surface 102 of the semiconductor substrate 100 faces upward, i.e., the semiconductor substrate 100 may be oriented such that the second surface 102 is an upper surface. Afterwards, a portion of the semiconductor substrate 100 may be removed to thin the semiconductor substrate 100. The thinning of the semiconductor substrate 100 may include performing a planarization process on the second surface 102 of the semiconductor substrate 100. The planarization process may be a chemical mechanical polishing process, for example.

Figure 3D:
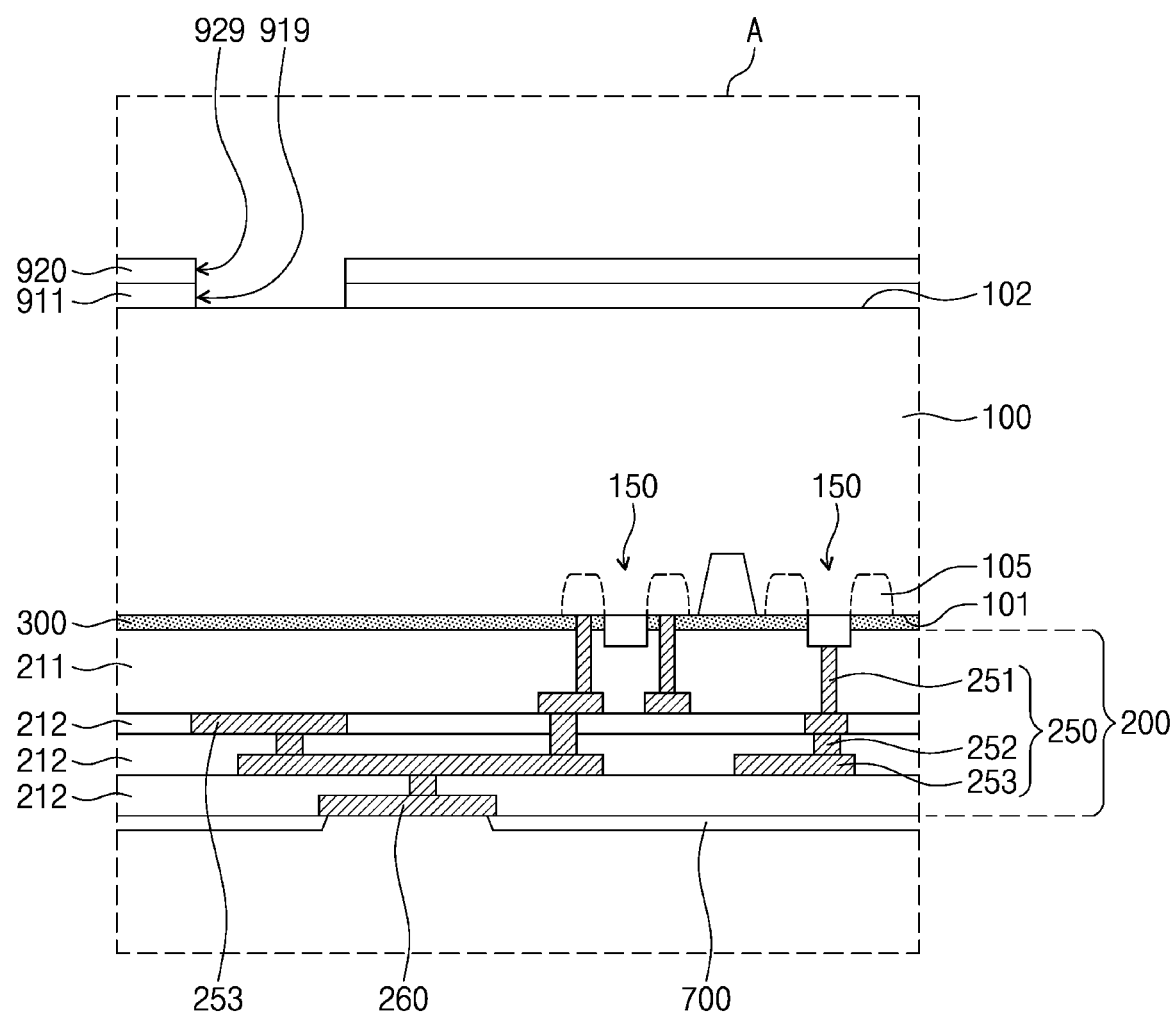

Referring to FIG. 3D, the first mask pattern 911 and the second mask pattern 920 are formed on the second surface 102 of the thinned semiconductor substrate 100. The first mask pattern 911 may cover the second surface 102 of the semiconductor substrate 100. The first mask pattern 911 may be a hard mask layer. The first mask pattern 911 may include a carbon-containing material such as a spin on carbon hard mask (SOC) material, for example. The second mask pattern 920 may be formed on the first mask pattern 911. The second mask pattern 920 may be formed by applying a photoresist material on the first mask pattern 911 to form a mask layer and by performing a patterning process on the mask layer to form the second mask pattern 920, for example. The patterning processes may include exposure and development processes. The second mask pattern 920 may have a guide opening 929. The first opening 919 may be formed in the first mask pattern 911 by an etching process using the second mask pattern 920. The first opening 919 may be aligned with the guide opening 929 and may expose the second surface 102 of the semiconductor substrate 100.

Figure 3E:
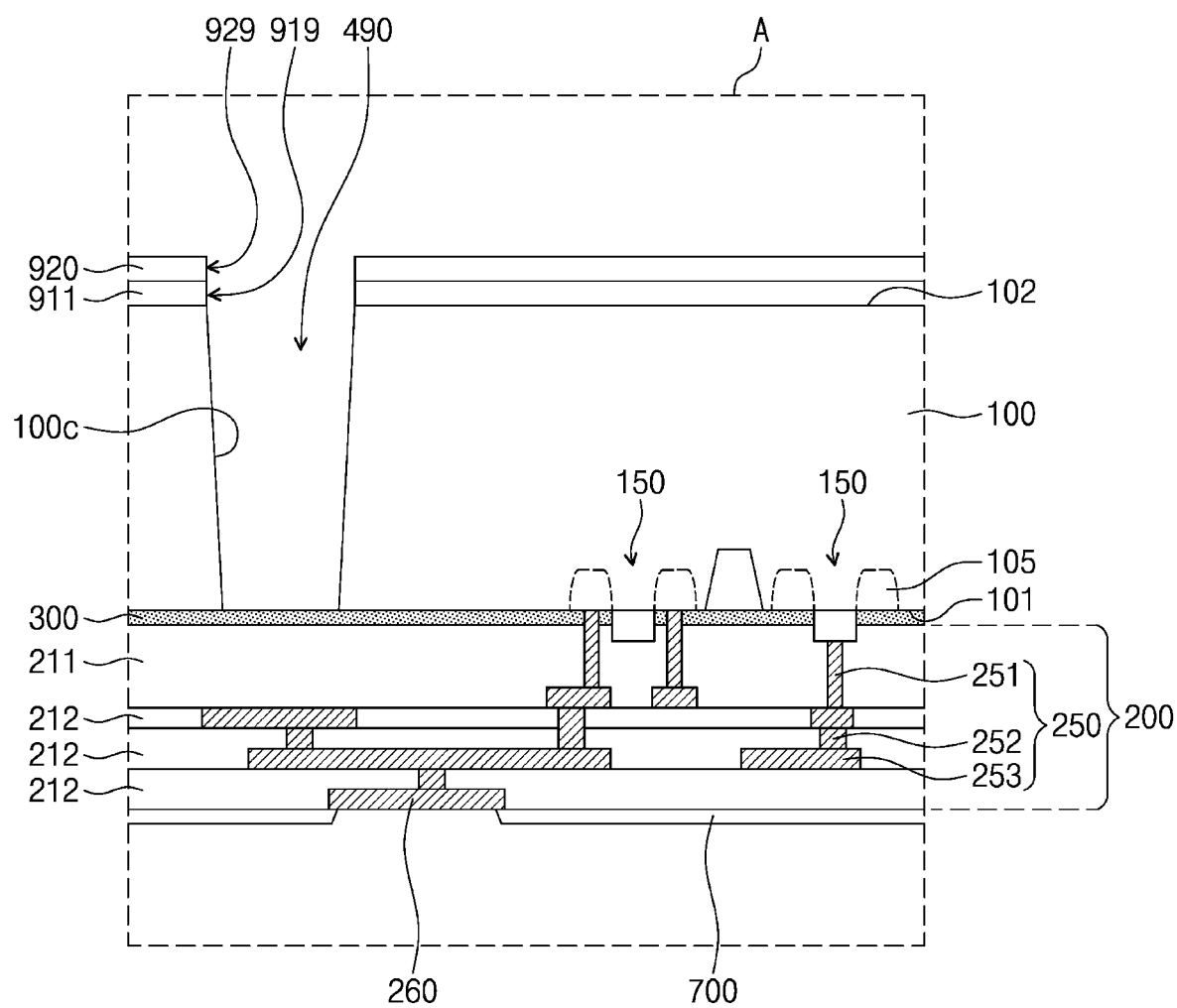

Referring to FIG. 3E, a through hole 490 is formed in the semiconductor substrate 100 to expose the etch stop layer 300. In example embodiments, a first etching process may be performed on the second surface 102 of the semiconductor substrate 100 exposed by the first opening 919 to form the through hole 490. The first etching process may be an anisotropic etching process, for example. The first etching process may include, for example, a dry etching process using a fluorine-containing gas. In the dry etching process, the etch stop layer 300 may have an etching selectivity with respect to the semiconductor substrate 100. For example, the etch stop layer 300 may have a very low etching rate or may not be etched. Accordingly, after the first etching process is completed, the through hole 490 may expose the top surface of the etch stop layer 300.

In the first etching process, an interface defect may be formed on the sidewall of the through hole 490. For example, the interface defect may be formed on the sidewall 100c of the semiconductor substrate 100 exposed by the through hole 490.

The through hole 490 may be spaced apart from the integrated circuits 150 by a predetermined distance. Accordingly, damage to the integrated circuits 150 may be prevented by the first etching process.

Figure 3F:
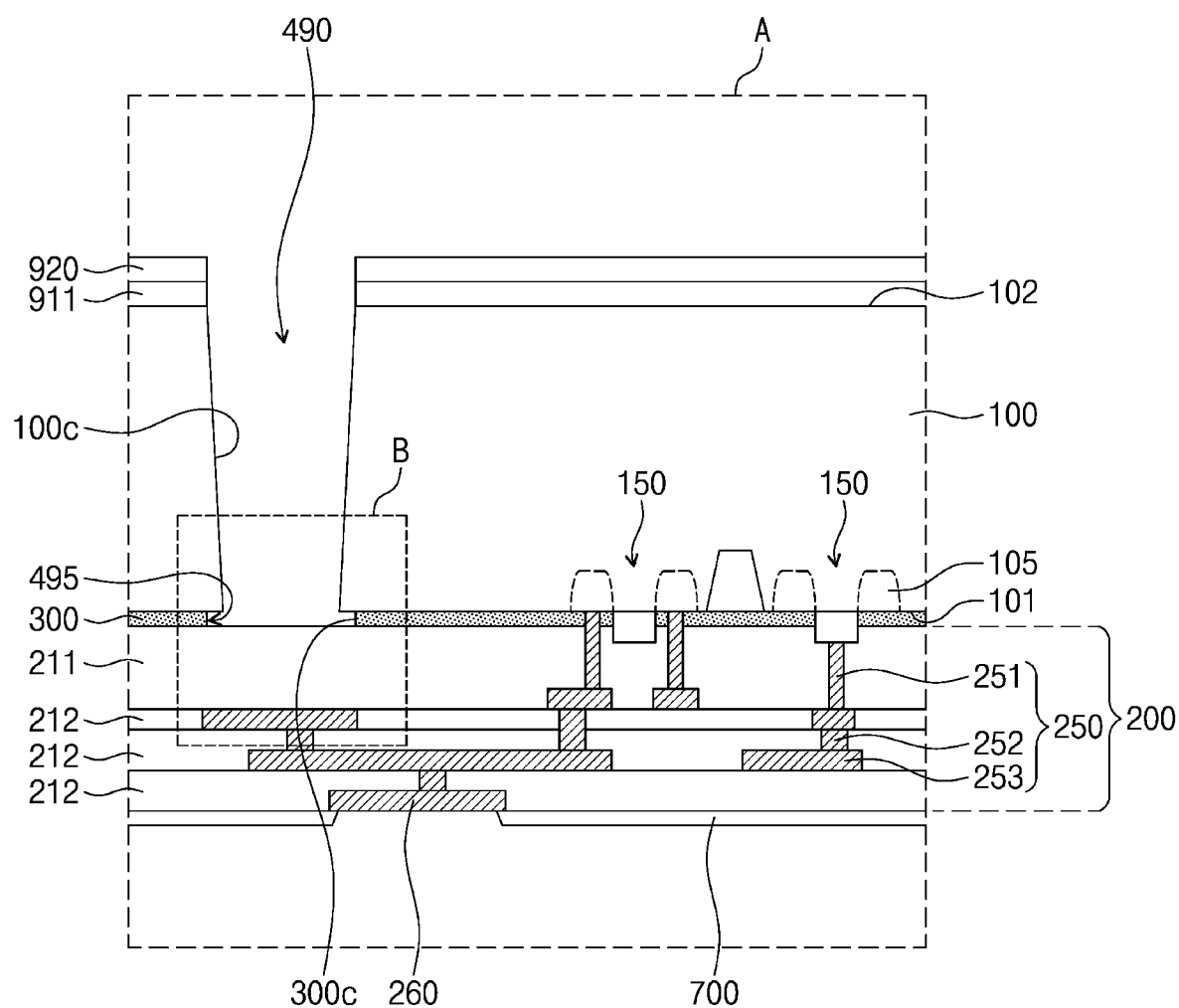
Figure 3G:
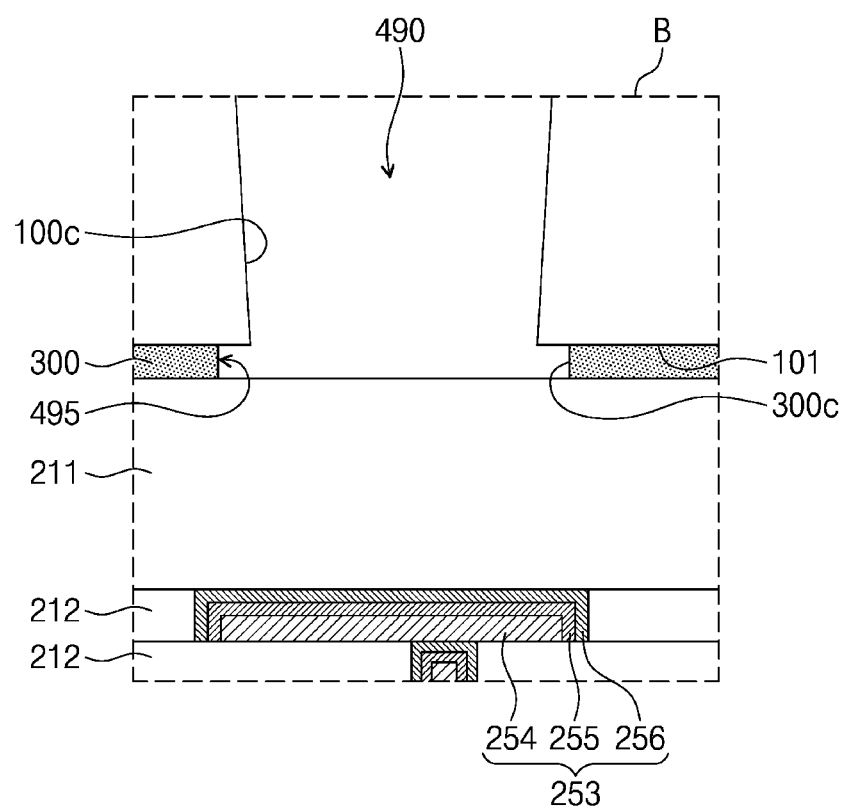
FIG. 3G is an enlarged view of region B of FIG. 3F.

Referring to FIGS. 3F and 3G, the etch stop layer 300 is removed to extend the through hole 490 into the etch stop layer 300. In example embodiments, a second etching process may be performed in the through hole 490 and on the etch stop layer 300. The second etching process may include a wet etching process. For example, an ammonium containing material may be used as an etchant during the second etching process. The etch stop layer 300 may be removed by the second etching process. Accordingly, the through hole 490 may extend into the etch stop layer 300. In the second etching process, the semiconductor substrate 100 and the first insulating layer 211 may have an etch selectivity with respect to the etch stop layer 300. For example, the semiconductor substrate 100 and the first insulating layer 211 may have a very low etching rate or may not be etched during the second etching process. The through hole 490 may expose the top surface of the first insulating layer 211.

The second etching process may be an isotropic etching process. The etch stop layer 300 exposed to the through hole 490 may be further removed horizontally to form a recess portion 495. The recess portion 495 may be connected to the through hole 490. The recess portion 495 may be recessed toward the etch stop layer 300 from the sidewall 100c of the semiconductor substrate 100. The recess portion 495 may expose the inner side surface 300c of the etch stop layer 300. The recess portion 495 may be formed between the first surface 101 and the first insulating layer 211.

Figure 3H:
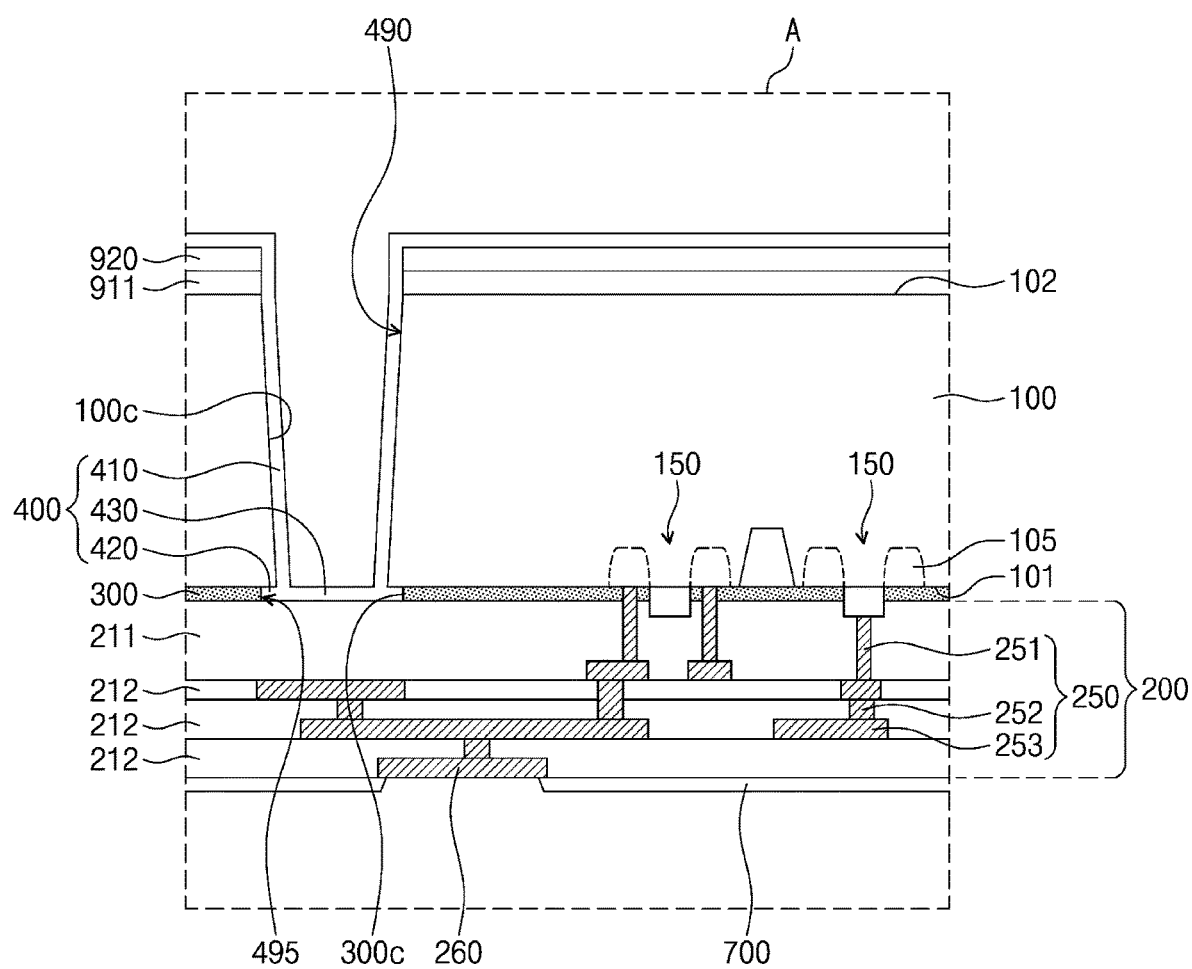

Referring to FIG. 3H, a separating layer 400 is formed in the through hole 490 and the recess portion 495. The separating layer 400 may be formed by a deposition process such as an atomic layer deposition process. The separating layer 400 may conformally cover the bottom surface and the sidewall of the through hole 490. For example, the separating layer 400 may conformally cover the exposed sidewall 100c of the semiconductor substrate 100, the top surface of the first insulating layer 211, and the top surface of the second mask pattern 920. The separating layer 400 may be provided in the recess portion 495. The separating layer 400 may fill the recess portion 495. For example, the separating layer 400 may cover the inner side surface 300c of the etch stop layer 300 and the exposed first surface 101 of the semiconductor substrate 100.

The separating layer 400 may include a first portion 410, a second portion 420, and a third portion 430. The first portion 410 may be provided on the sidewall 100c of the semiconductor substrate 100. The second portion 420 may be provided in the recess portion 495. The third portion 430 may be provided on the top surface of the first insulating layer 211 and may not extend into the recess portion 495. The third portion 430 may be surrounded by the first portion 410 in a plan view.

Figure 3I:
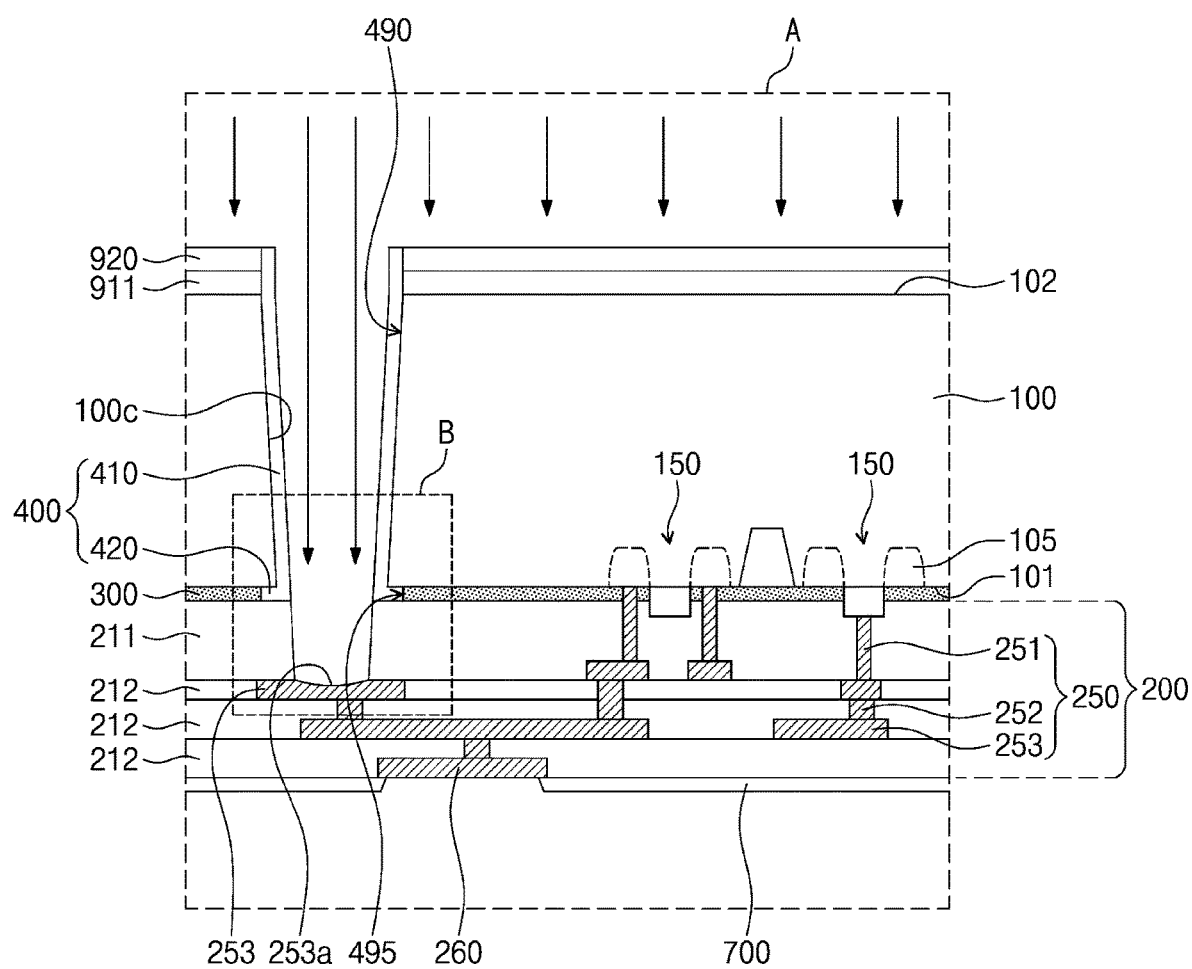

Referring to FIGS. 3H and 3I, the third portion 430 and a portion of the first insulating layer 211 are removed to extend the through hole 490 into the first insulating layer 211. In example embodiments, a third etching process may be performed on the separating layer 400 in the through hole 490. The third etching process may be, for example, an anisotropic etching process. The third etching process may be performed by a dry etching process using a fluorine-containing gas, for example. The third portion 430 and the portion of the first insulating layer 211 of the separating layer 400 may be removed by the third etching process. The portion of the first insulating layer 211 that is removed may be a portion interposed between the third portion 430 and one of the wiring patterns 253. The through hole 490 may extend into the first insulating layer 211 by the third etching process, and the wiring pattern 253 may be exposed. Unless stated otherwise in the following description, a wiring pattern 253 may refer to one wiring pattern 253 connected to or contacting a through via structure 500, from among a plurality of wiring patterns 253.

During the third etching process, the upper portion of the wiring pattern 253 may be partially etched. Accordingly, the upper surface 253a of the wiring pattern 253 exposed in the through hole 490 may be recessed. The upper surface 253a of the wiring pattern 253 exposed to the through hole 490 may be disposed at a lower level than the upper surface 253a of the wiring pattern 253 covered by the first insulating layer 211. The recessed upper surface 253a of the wiring pattern 253 may be rounded or curved. For example, the recessed upper surface 253a of the wiring pattern 253 may be convex downward. In another example embodiment, the upper surface 253a of the wiring pattern 253 exposed to the through hole 490 may be substantially flat.

The separation layer 400 on the second mask pattern 920 may be further removed by the third etching process to expose the second mask pattern 920. After the third etching process is completed, the first portion 410 and the second portion 420 of the separating layer 400 may remain.

When the etch stop layer 300 is omitted and the through hole 490 is formed in the semiconductor substrate 100 and the first insulating layer 211 by a single etching process, it may be difficult to control the etching process. For example, the wiring pattern 253 may be damaged during the etching process. Alternatively, in the etching process of the separating layer 400, the separating layer 400 may be damaged. In example embodiments, an etch stop layer 300 may be formed between the semiconductor substrate 100 and the wiring pattern 253, and the etch stop layer 300 may be formed between the semiconductor substrate 100 and the first insulating layer 211. It may have different etching selectivity. Accordingly, the through hole 490 may be formed through the first etching process, the second etching process, and the third etching process to expose the wiring pattern 253. Since the formation of the through hole 490 is performed through a plurality of etching processes, the etching of the through hole 490 may be more precisely controlled. Accordingly, unintended etching of the wiring pattern 253 or the separating layer may be reduced, suppressed, or prevented.

Figure 3J:
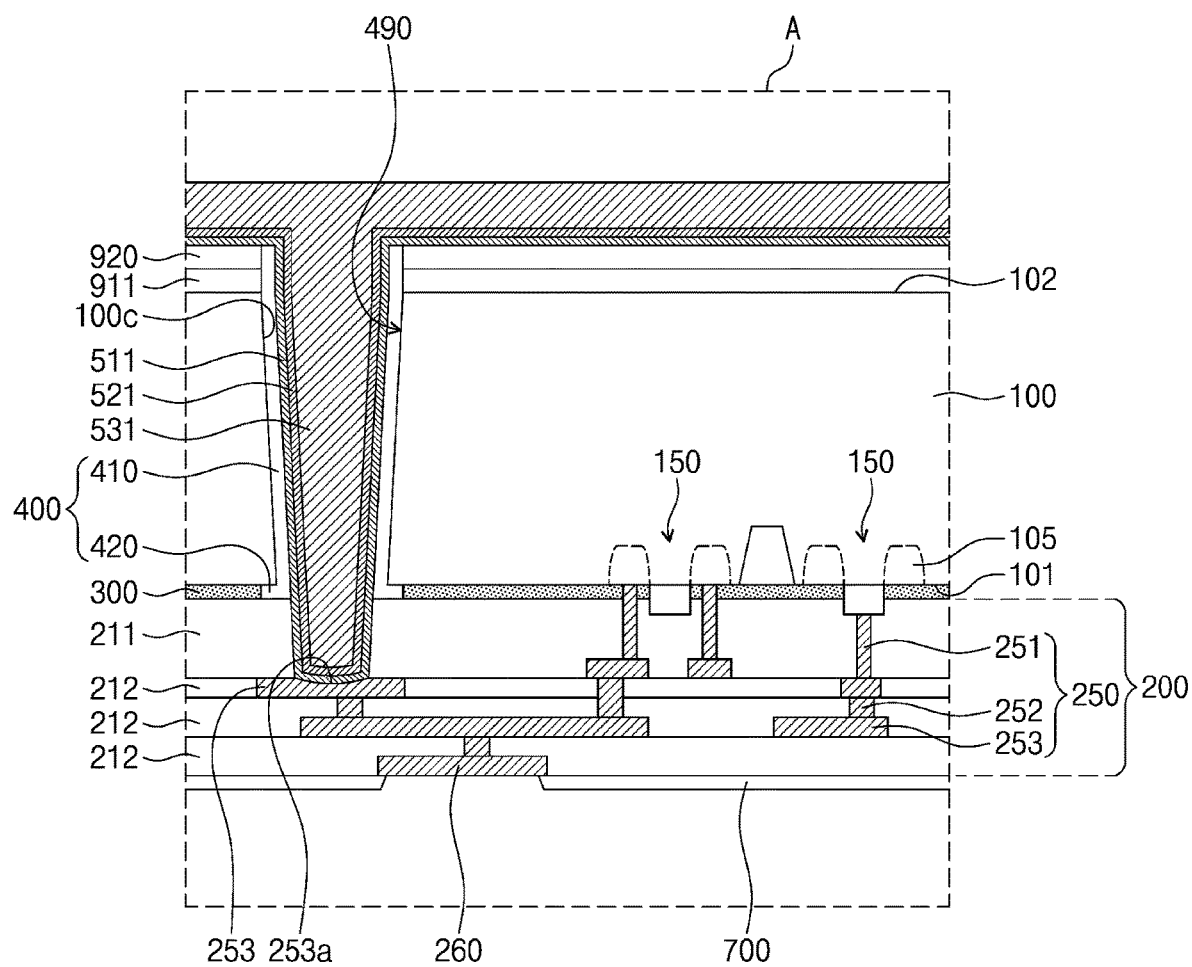

Referring to FIG. 3J, the barrier layer 511, the seed layer 521, and the through via layer 531 are formed in the through hole 490 and on the second surface 102 of the semiconductor substrate 100. In example embodiments, the barrier layer 511 may be formed by a deposition process to conformally cover the inner sidewall and the bottom surface of the through hole 490. For example, the barrier layer 511 may be formed on an upper surface 253a of the wiring pattern 253, an inner sidewall of the first insulating layer 211, a first inner wall of the first portion 410, and a second inner wall of the second portion. The barrier layer 511 may be horizontally spaced apart from the etch stop layer 300 by the second portion 420 of the separating layer 400. The barrier layer 511 may be horizontally spaced apart from the semiconductor substrate 100 by the first portion 410 of the separating layer 400. The barrier layer 511 may further extend on the second surface 102 of the semiconductor substrate 100 to cover the second mask pattern 920. The seed layer 521 may be formed on the barrier layer 511. The seed layer 521 may conformally cover the barrier layer 511 in the through hole 490 and on the second surface 102 of the semiconductor substrate 100.

A through via layer 531 may be formed on the seed layer 521 to fill the through hole 490. Formation of the through via layer 531 may include performing an electroplating process using the seed layer 521 as an electrode. The through via layer 531 may extend on the second surface 102 of the semiconductor substrate 100 to cover the seed layer 521.

Referring back to FIGS. 2A and 2B, a planarization process may be performed on the through via layer 531 to form a through via structure 500. The through via structure 500 may include a barrier pattern 510, a seed pattern 520, and a conductive via 530. According to embodiments, the planarization process may include a chemical mechanical polishing (CMP) process. The barrier layer 511, the seed layer 521, and the through via layer 531 may be planarized to form the barrier pattern 510, the seed pattern 520, and the conductive via 530, respectively. The barrier layer 511, the seed layer 521, the through via layer 531, and the separation layer 400 on the second surface 102 of the semiconductor substrate 100 may be removed by the planarization process. The through via structure 500 may be disposed in the through hole 490.

The second mask pattern 920, the top portion of the separating layer 400, and the top portion of the first mask pattern 911 may be removed by the planarization process. As a result of the planarization process, a lower portion of the remaining first mask pattern 911 may form a third insulating layer 910. The top surface of the through via structure 500 may be disposed at substantially the same level as the top surface of the third insulating layer 910. In another example embodiment, the planarization process may be performed until the semiconductor substrate 100 is exposed.

As described above, when the etch stop layer 300 is omitted and the through hole 490 is formed in a single etching process, contact resistance can be increased due to damage of the wiring pattern 253. Alternatively, it may be difficult to fill the inside of the through hole 490 well enough to adequately form the through via structure 500. When the separating layer 400 is excessively etched, at least a portion of the through via structure 500 may contact the semiconductor substrate 100. Accordingly, electrical separation between the through via structure 500 and the semiconductor substrate 100 may be insufficient.

According to some example embodiments, the through hole 490 may be formed by the first to third etching processes to prevent unwanted etching of the wiring pattern 253 and the separating layer 400. Accordingly, the through via structure 500 may satisfactorily fill the inside of the through hole 490, and the contact resistance between the through via structure 500 and the wiring pattern 253 may be improved. The through via structure 500 may be spaced apart from the semiconductor substrate 100 by the separating layer 400 and may be electrically separated. The reliability of the semiconductor device can be improved.

The through via structure 500 may be formed by a via last process. For example, after the process of forming the integrated circuits 150 and the wiring layer 200 and the process of thinning the semiconductor substrate 100, the through via structure 500 may be formed.

The conductive pad 620 may be formed on the top surface of the through via structure 500 and on the third insulating layer 910 to be electrically connected to the through via structure 500. Although not shown, an upper passivation layer may be further formed on the third insulating layer 910. The connection terminal 610 may be formed on the bottom surface of the terminal pad 260. As described so far, the manufacturing of the semiconductor device can be completed.

Figure 4E:
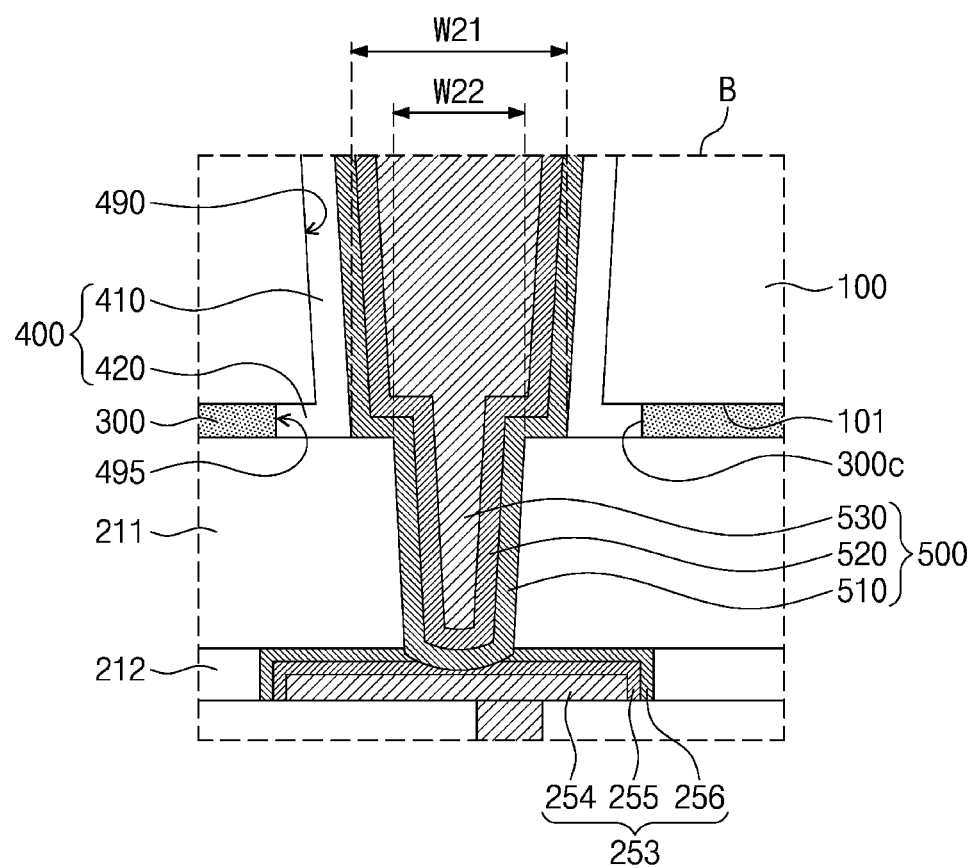
FIG. 4E is an enlarged view of region B of FIG. 4D.

FIGS. 4A, 4B, and 4D are cross-sectional views for describing a method of manufacturing a semiconductor device, in accordance with some embodiments of the inventive concepts, and correspond to the enlarged views of region A of FIG. 1. FIG. 4C is an enlarged view of region B of FIG. 4B. FIG. 4E is an enlarged view of region B of FIG. 4D. Hereinafter, descriptions repeating explanations described above will be omitted.

Referring to FIG. 3A through FIG. 3G, an etch stop layer 300 and a wiring layer 200 may be formed on the first surface 101 of a semiconductor substrate 100. First and second mask patterns 911 and 920 may be formed on the second surface 102 of the semiconductor substrate 100. The through hole 490 may be formed in the semiconductor substrate 100 by the first etching process. The through hole 490 may extend into the etch stop layer 300 by the second etching process, and a recess portion 495 may be formed. The separating layer 400 may be formed on the bottom and inner walls of the through hole 490 and in the recess portion 495. The separating layer 400 may extend on the sidewalls and the top surface of the second mask pattern 920.

Referring to FIG. 4A, a capping pattern 930 may be formed on the top surface and sidewalls of the second mask pattern 920 to cover the separating layer 400. The capping pattern 930 may block a part of the guide opening 929. The capping pattern 930 may have a second opening 939, and the second opening 939 may be connected to the through hole 490. The width W20 of the second opening 939 may be narrower than the width W10 of the through hole 490 on the second surface 102 of the semiconductor substrate 100. The second opening 939 may overlap the center area of the through hole 490 in a plan view.

The capping pattern 930 may include a material having an etch selectivity with respect to the separating layer 400. The capping pattern 930 may include a nitrogen-containing material. The capping pattern 930 may include, for example, silicon nitride, silicon carbide nitride, and/or silicon oxynitride.

Referring to FIGS. 4B and 4C, a third etching process may be performed on the separating layer 400 exposed by the second opening 939. The third etching process may be, for example, an isotropic dry etching process. The third portion 430 of the separating layer 400 and the portion of the first insulating layer 211 may be removed by the third etching process, and the top surface of the wiring pattern 253 may be exposed. In this case, the third portion 430 and the portion of the first insulating layer 211 may be vertically overlapped with the second opening 939. The second opening 939 may not vertically overlap with the separating layer 400 on the sidewall 100c of the semiconductor substrate 100. The capping pattern 930 may prevent the first portion 410 of the separating layer 400 from being etched during the third etching process. As used herein, unless clearly indicated otherwise, "vertical" may mean a direction substantially parallel to a direction perpendicular to the first surface 101 of the semiconductor substrate 100. The through hole 490 may extend into the first insulating layer 211 by the third etching process.

Since the second opening 939 has a narrower width W20 than the through hole 490, the width of the through hole 490 in the first insulating layer 211 can be smaller than the width of the through hole 490 in the semiconductor substrate 100. For example, as illustrated in FIG. 4C, the maximum width W12 of the through hole 490 in the first insulating layer 211 may be smaller than the minimum width W11 of the through hole 490 in the semiconductor substrate 100.

An upper surface of the wiring pattern 253 exposed by the third etching process may be further recessed as described in the example of the conductive pad 620 with reference to FIG. 3I. In another example embodiment, the top surface of the wiring pattern 253 exposed by the through hole 490 may be substantially flat.

Referring to FIGS. 4D and 4E, the capping pattern 930 (see FIG. 4B) may be removed, and the through via structure 500 may be formed in the through hole 490. The formation of the through via structure 500 may be similar as described with reference to FIGS. 2A, 2B, and 3J. As described with reference to FIG. 3J, the through via structure 500 may be formed by forming the barrier layer 511, the seed layer 521 and the through via layer 531, and by planarizing the barrier layer 511, the seed layer 521 and the through via layer 531 to form the barrier pattern 510, the seed pattern 520, and the conductive via 530, respectively. During the planarization process, the second mask pattern 920, the upper portion of the first mask pattern 911, and the upper portion of the separating layer 400 may be removed together. After the planarization process, a lower portion of the remaining first mask pattern 911 may form a third insulating layer 910.

According to an embodiment, the through via structure 500 may have a shape corresponding to the through hole 490. As shown in FIG. 4E, the maximum width W22 of the through via structure 500 in the first insulating layer 211 may be smaller than the minimum width W21 of the through via structure 500 in the semiconductor substrate 100. The bottom surface 500b of the through via structure 500 may be convex downward. An upper surface of the wiring pattern 253 may include a first upper surface in contact with the through via structure 500 and a second upper surface in contact with the first insulating layer 211. The first upper surface of wiring pattern 253 may be disposed at a lower level than the second upper surface of wiring pattern 253. By the examples described so far, a semiconductor device can be manufactured.

Figure 5A:
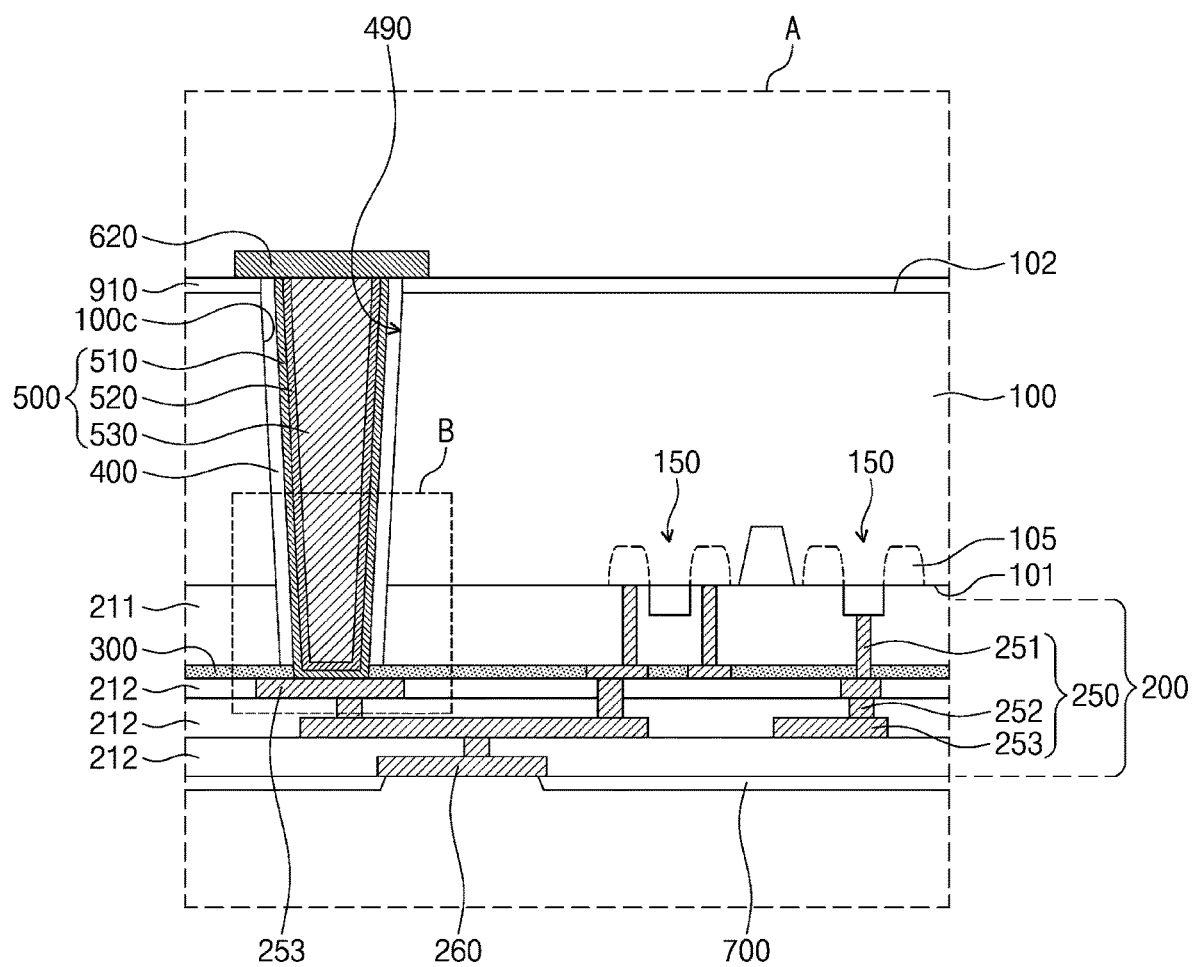
FIG. 5A is a cross-sectional view illustrating a semiconductor device in accordance with example embodiments.
Figure 5B:
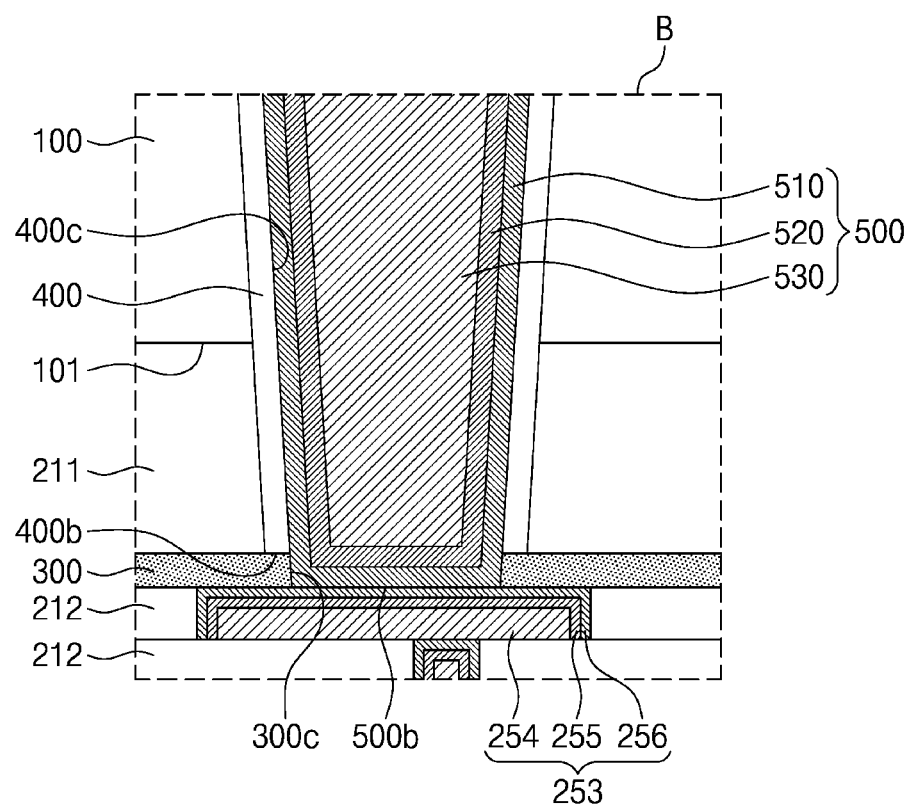
FIG. 5B is an enlarged view of the region B of FIG. 5A.

FIG. 5A is a cross-sectional view illustrating a semiconductor device in accordance with example embodiments, and corresponds to an enlarged view of region A of FIG. 1. FIG. 5B shows an enlarged view of the region of FIG. 5A. Hereinafter, descriptions repeating explanations described above will be omitted.

Referring to FIGS. 5A and 5B, the semiconductor device may include a semiconductor substrate 100, a wiring layer 200, an etch stop layer 300, a separating layer 400, and a through via structure 500. The semiconductor substrate 100, the wiring layer 200, and the through via structure 500 may be the same as or similar to those described with reference to FIGS. 2A through 2C. The wiring layer 200 may include a first insulating layer 211, second insulating layers 212, and a wiring structure 250. The wiring structure 250 may include a contact plug 251, a metal via 252, and a wiring pattern 253. The wiring pattern 253 may include a barrier metal film 256, a seed metal film 255, and a metal pattern 254 as shown in FIG. 5B.

Additionally, the etch stop layer 300 may be provided between the first insulating layer 211 and the uppermost second insulating layer 212 and between the first insulating layer 211 and the wiring pattern 253. The etch stop layer 300 may be in physical contact with the top surface of the wiring pattern 253. For example, the etch stop layer 300 may be in physical contact with the barrier metal film 256 (barrier metal layer) as shown in FIG. 5B.

The through via structure 500 may be provided in the semiconductor substrate 100, the first insulating layer 211, and the etch stop layer 300. The through via structure 500 may be horizontally spaced apart from the integrated circuits 150. The through via structure 500 may include a barrier pattern 510, a seed pattern 520, and a conductive via 530. As shown in FIG. 5B, the bottom surface 500b of the through via structure 500 may be substantially flat. The bottom surface 500b of the through via structure 500 may contact the barrier metal film 256 (barrier metal layer). The through via structure 500 may not contact the seed metal film 255 (seed metal layer).

The separating layer 400 may surround sidewalls of the through via structure 500. The separating layer 400 may be interposed between the semiconductor substrate 100 and the through via structure 500 and between the first insulating layer 211 and the through via structure 500. The separation layer 400 may not extend into the etch stop layer 300. As shown in FIG. 5B, the lowermost surface 400b of the separating layer 400 may be disposed at a level substantially the same as or higher than that of the upper surface of the etch stop layer 300. The separation layer 400 may expose the inner side surface 300c of the etch stop layer 300. The inner wall 400c of the separation layer 400 and the inner side surface 300c of the etch stop layer 300 may be in physical contact with the through via structure 500. The separating layer 400 may contact a portion of the etch stop layer 300. For example, a lower portion of the separating layer 400 may contact a portion of the etch stop layer 300, and a lower portion of the separating layer 400 may be a portion including a lowermost surface 400b.

FIGS. 6A through 6E are cross-sectional views for describing a method of manufacturing a semiconductor device, in accordance with example embodiments. Hereinafter, descriptions repeating explanations described above will be omitted.

Figure 6A:
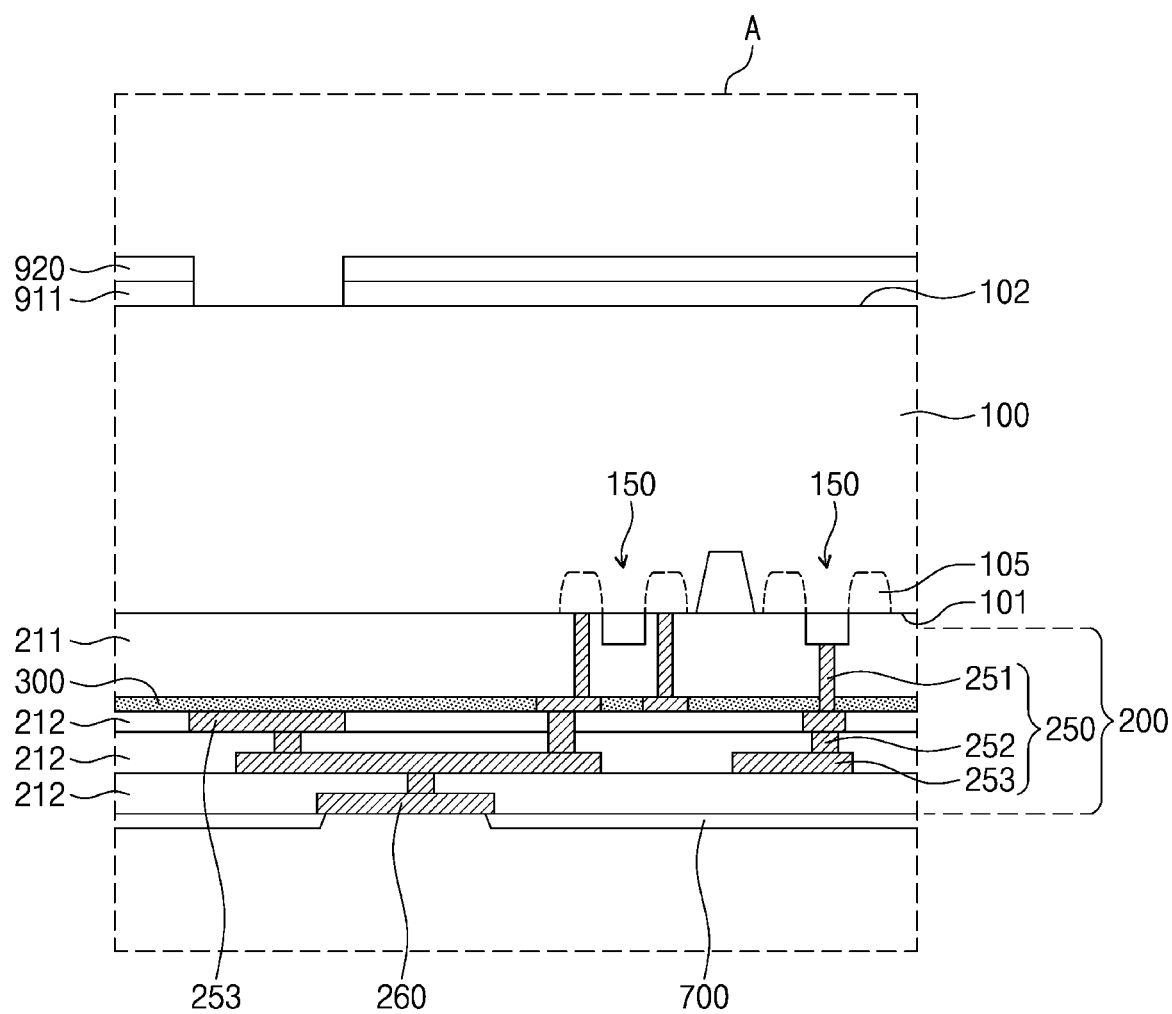
FIGS. 6A through 6E are cross-sectional views for describing a method of manufacturing a semiconductor device in accordance with example embodiments.

Referring to FIG. 6A, a wiring layer 200 and an etch stop layer 300 may be formed on the first surface 101 of the semiconductor substrate 100. Formation of the wiring layer 200 may be performed by similar methods as described above with reference to FIG. 2A. However, the etch stop layer 300 may be formed between the first insulating layer 211 and wiring pattern 253 and between the first insulating layer 211 and the second insulating layer 212. A thinning process may be performed on the second surface 102 of the semiconductor substrate 100 to remove a portion of the semiconductor substrate 100. The first mask pattern 911 and the second mask pattern 920 may be formed on the second surface 102 of the thinned semiconductor substrate 100.

Figure 6B:
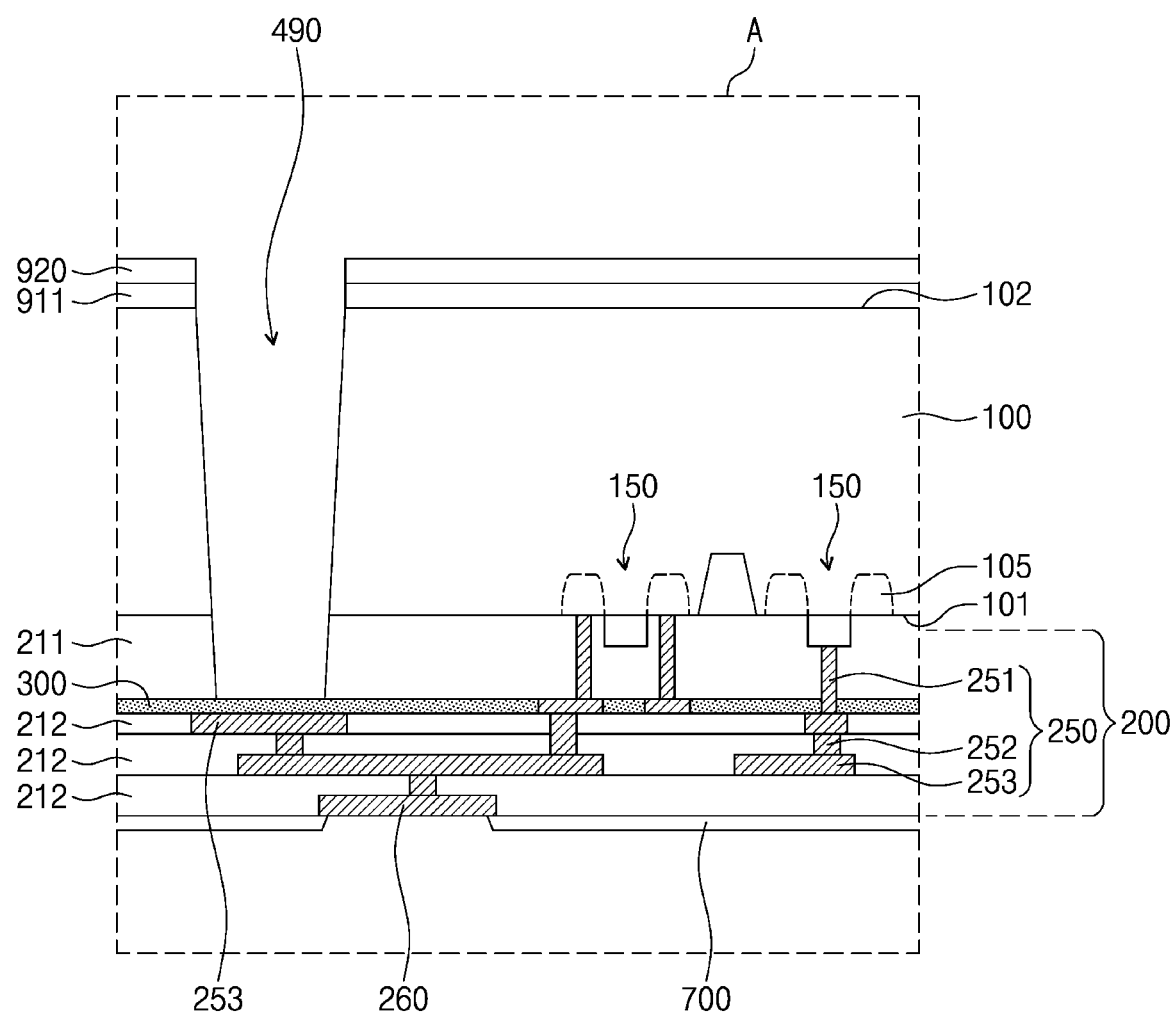

Referring to FIG. 6B, a first etching process may be performed as to the semiconductor substrate 100 so that a through hole 490 may be formed in the semiconductor substrate 100 and the first insulating layer 211. In the first etching process, the mask patterns 911 and 920 may be used as an etching mask. In the first etching process, the etch stop layer 300 may have an etching selectivity with respect to the semiconductor substrate 100 and the first insulating layer 211. After the first etching process is completed, the through hole 490 may expose the top surface of the etch stop layer 300.

Figure 6C:
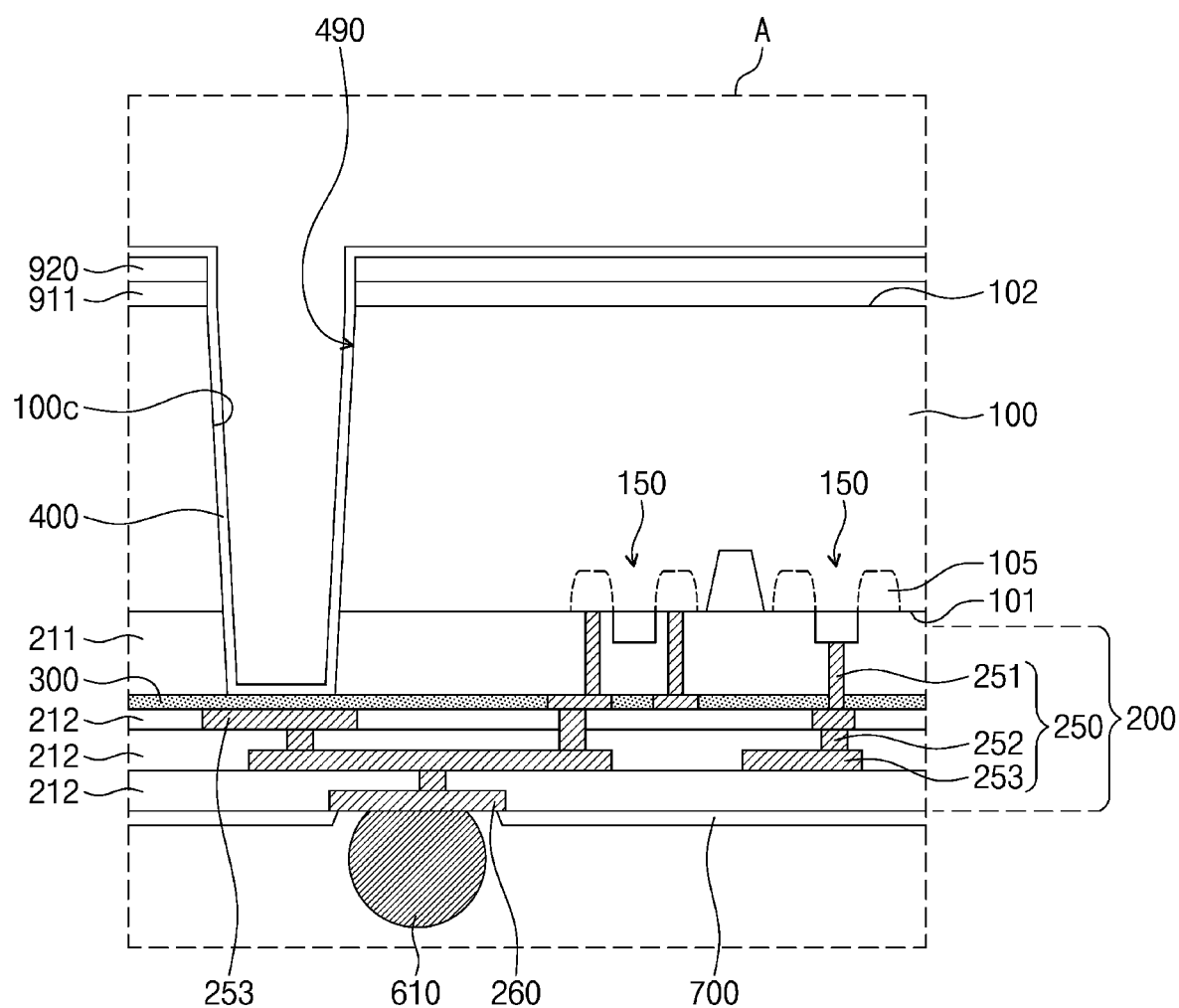

Referring to FIG. 6C, a separating layer 400 may be formed in the through hole 490 to cover the bottom surface and the sidewall of the through hole 490. For example, the separating layer 400 may conformally cover the exposed sidewall 100c of the semiconductor substrate 100, the sidewall of the first insulating layer 211, and the top surface of the etch stop layer 300. The separating layer 400 may extend on an upper surface of the second mask pattern 920.

Figure 6D:
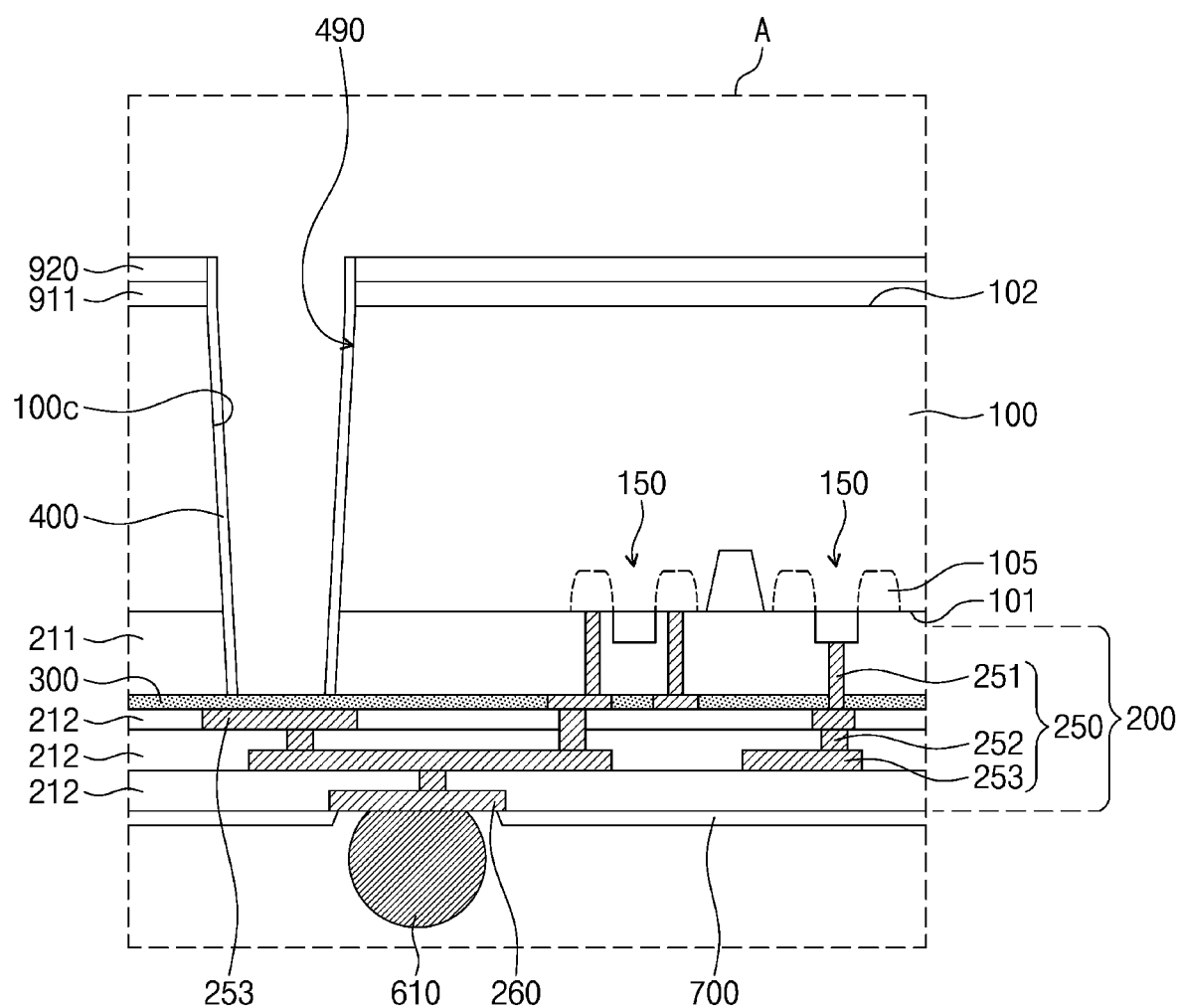

Referring to FIG. 6D, a third etching process may be performed to remove a portion of the separating layer 400. A portion of the separating layer 400 may include a portion of the separating layer 400 on the top surface of the etch stop layer 300 and a portion of the separating layer 400 on the second mask pattern 920. In example embodiments, the third etching process may include an anisotropic dry etching process and may be performed under similar conditions as the example of the third etching process of FIG. 3I, explained above. In the third etching process, the etch stop layer 300 may have an etching selectivity with respect to the separating layer 400. After the third etching process, the through hole 490 may expose the top surface of the etch stop layer 300. The separating layer 400 may remain on the sidewall 100c of the semiconductor substrate 100 and the sidewall of the first insulating layer 211.

Figure 6E:
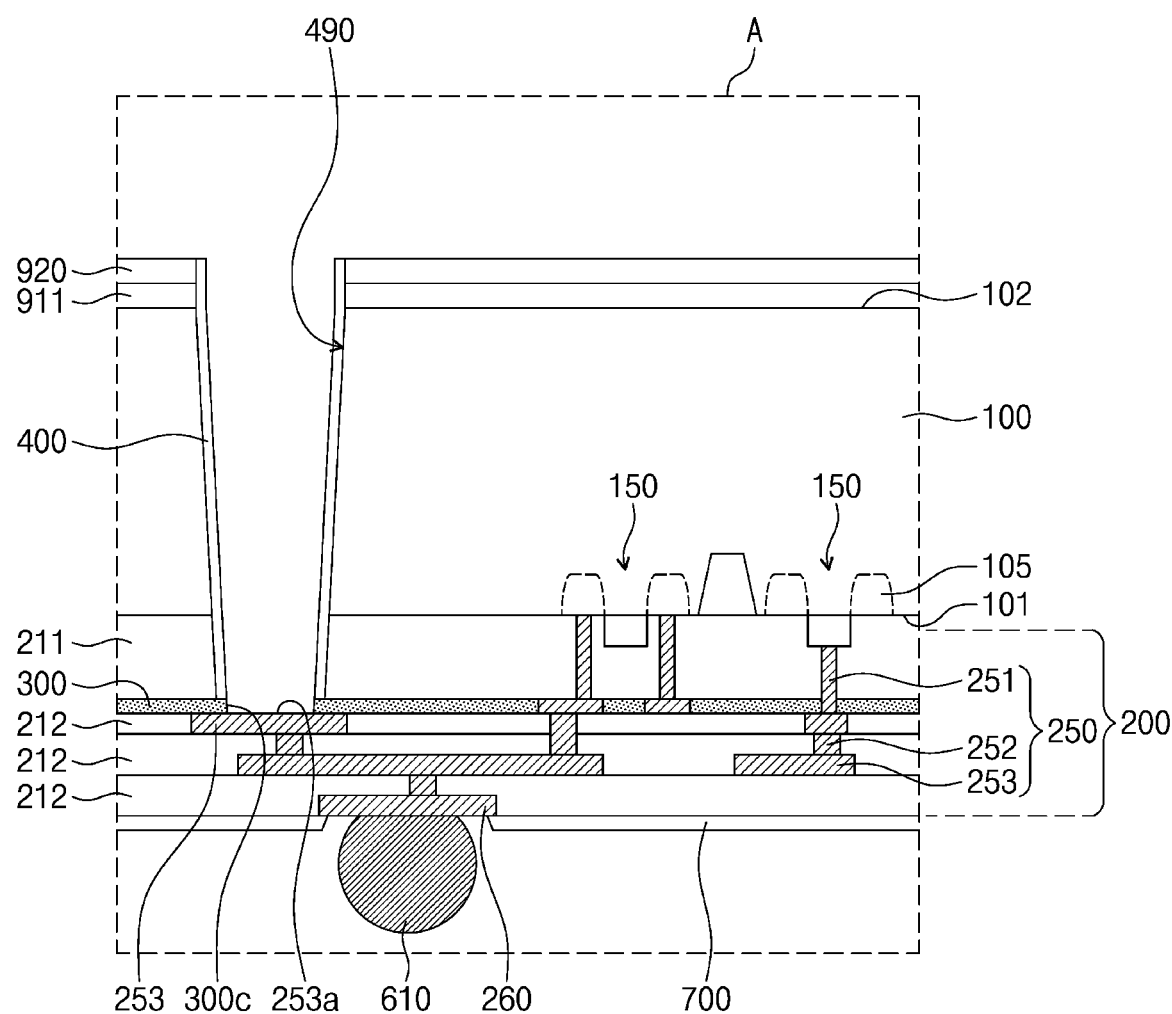

Referring to FIG. 6E, a second etching process may be performed to remove the exposed etch stop layer 300. The second etching process may include a wet etching process. Accordingly, the through hole 490 may extend into the etch stop layer 300. The inner side surface 300c of the etch stop layer 300 may be exposed to the through hole 490.

In the second etching process, the wiring pattern 253 may not be etched. After the second etching process, the through hole 490 may expose the top surface 253a of the wiring pattern 253. The upper surface 253a of the exposed wiring pattern 253 may be substantially flat or planar.

Referring back to FIGS. 5A and 5B, a through via structure 500 may be formed in the through hole 490. Formation of the through via structure 500 may be performed in substantially the same manner as described with reference to FIGS. 2A, 2B, and 3J. As described with reference to FIG. 3J, the through via structure 500 may be formed by forming the barrier layer 511 (barrier film), the seed layer 521 (seed film) and the through via layer 531

(through via film), and then, by planarizing the barrier layer 511 (barrier film), the seed layer 521 (seed film) and the through via layer 531 to form the barrier pattern 510, the seed pattern 520 and the conductive via 530, respectively. The second mask pattern 920, the upper portion of the first mask pattern 911, and the upper portion of the separating layer 400 may be removed in the planarization process. After the planarization process, a third insulating layer 910 may be formed under the remaining first mask pattern 911. Thereafter, the conductive pad 620 and the connection terminal 610 may be formed. By the example embodiments described so far, a semiconductor device can be manufactured.

Figure 7:
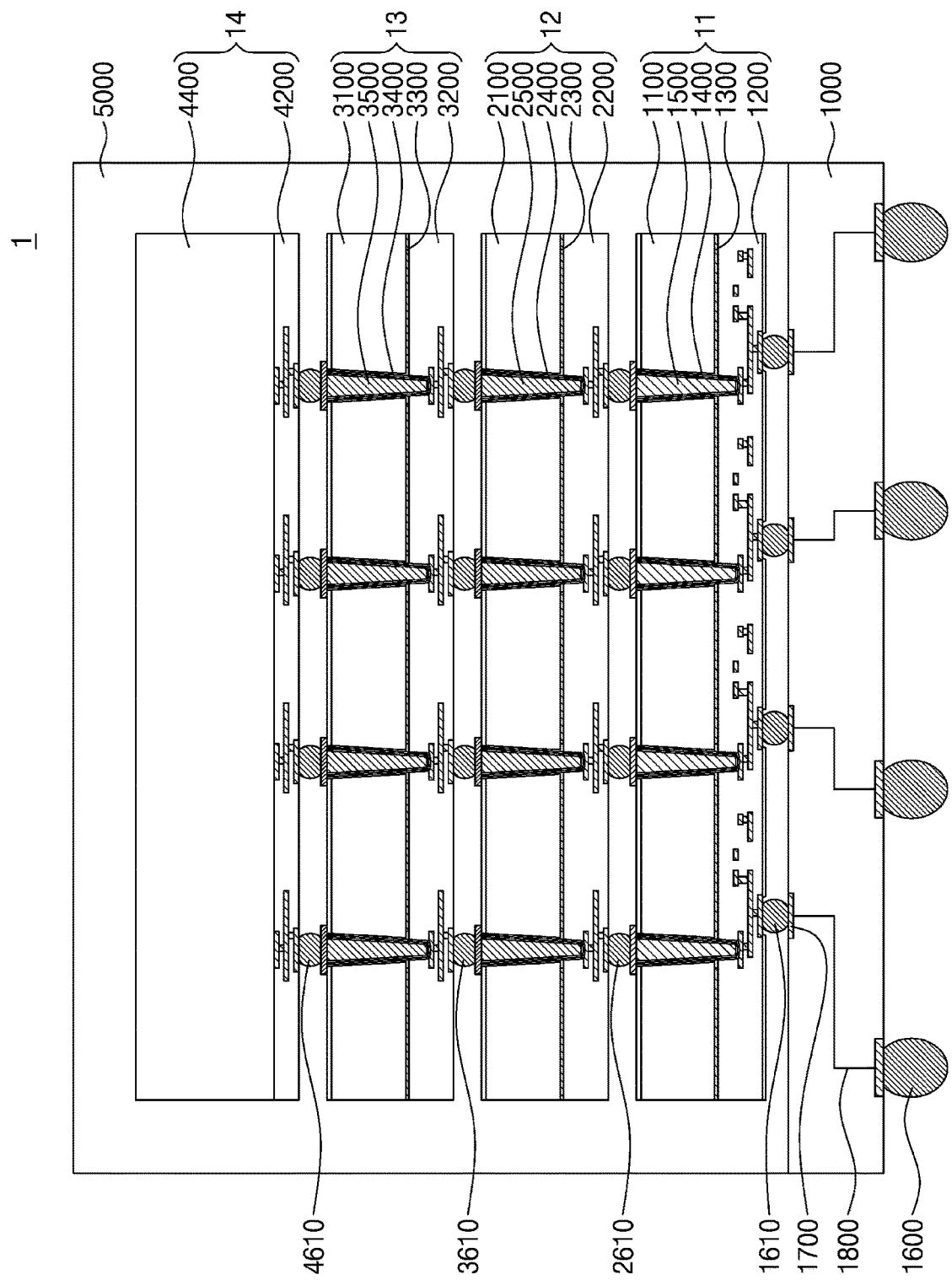
FIG. 7 is a cross-sectional view illustrating a semiconductor package in accordance with example embodiments.

FIG. 7 is a cross-sectional view illustrating a semiconductor package in accordance with example embodiments. Hereinafter, descriptions repeating explanations described above will be omitted.

Referring to FIG. 7, the semiconductor package 1 includes a package substrate 1000, may include first to fourth semiconductor devices 11, 12, 13, and 14, and includes a molding film 5000. The package substrate 1000 may include a printed circuit board or a redistribution layer. The external terminal 1600 may be disposed on the bottom surface of the package substrate 1000. The metal pad 1700 may be disposed on the top surface of the package substrate 1000. The metal pad 1700 may be electrically connected to the external terminal 1600 through the internal wiring 1800.

Each of the first to the third semiconductor devices 11, 12, and 13 may be the same as or similar to the semiconductor device of FIG. 1. At least one of the first to the third semiconductor devices 11, 12, and 13 may be the same as or similar to the semiconductor device described with reference to FIGS. 2A to 2C, the semiconductor device of FIGS. 4D and 4E, or the semiconductor device of FIGS. 5A and 5B. The first semiconductor device 11 may include a first semiconductor substrate 1100, a first wiring layer 1200, a first etch stop layer 1300, a first separating layer 1400, and a first through via structure 1500. The second semiconductor device 12 may include a second semiconductor substrate 2100, a second wiring layer 2200, a second etch stop layer 2300, a second separating layer 2400, and a second through via structure 2500. The third semiconductor device 13 may include a third semiconductor substrate 3100, a third wiring layer 3200, a third etch stop layer 3300, a third separating layer 3400, and a third through via structure 3500.

The first semiconductor substrate 1100, the second semiconductor substrate 2100, the third semiconductor substrate 3100, and the fourth semiconductor substrate 4100 may be substantially the same as or similar to the semiconductor substrate 100 described in the example of FIG. 1, the examples of FIGS. 2A to 2C, and FIG. 4D and FIG. 4E, or the examples of FIGS. 5A and 5B. The first wiring layer 1200, the second wiring layer 2200, the third wiring layer 3200, and the fourth wiring layer 4200 may be substantially the same as or similar to the wiring layer 200 described in the example the example of FIG. 1, the examples of FIGS. 2A to 2C, the examples of FIGS. 4D and 4E, or the examples of FIGS. 5A and 5B. The first etch stop layer 1300, the second etch stop layer 2300, and the third etch stop layer 3300 may be substantially the same as or similar to the etching stop layer 300 described with reference to the example of FIG. 1, the examples of FIGS. 2A to 2C, the examples of FIGS. 4D and 4E, or the examples of FIGS. 5A and 5B. The first separating layer 1400, the second separating layer 2400, and the third separating layer 3400 may be substantially the same as or similar to the separating layer 400 described above. The first through via structure 1500, the second through via structure 2500, and the third through via structure 3500 may be substantially the same as or similar to the through via structure 500 described in the example of FIG. 1, the examples of FIGS. 2A to 2C, the examples of FIGS. 4D and 4E, or the examples of FIGS. 5A and 5B.

The first semiconductor device 11 may be mounted on the package substrate 1000. For example, the first connection terminal 1610 may be connected to the metal pad 1700, and the first semiconductor device 11 may be electrically connected to the external terminal 1600 through the first connection terminal 1610. The first connection terminal 1610 may be substantially the same as or similar to the connection terminal 610 described with reference to FIGS. 1 and 2A.

The second semiconductor device 12 may be mounted on the first semiconductor device 11. The second connection terminal 2610 may be provided between the first semiconductor device 11 and the second semiconductor device 12. The second semiconductor device 12 may be electrically connected to the first semiconductor device 11 and the package substrate 1000 through the second connection terminal 2610. The second connection terminal 2610 may be substantially the same as or similar to the connection terminal 610 described with reference to FIGS. 1 and 2A.

The third semiconductor device 13 may be mounted on the second semiconductor device 12. The third connection terminal 3610 may be interposed between the second semiconductor device 12 and the third semiconductor device 13. The third semiconductor device 13 may be electrically connected to the first semiconductor device 11, the second semiconductor device 12, or the package substrate 1000 through the third connection terminal 3610. The third connection terminal 3610 may be substantially the same as or similar to the connection terminal 610 described with reference to FIGS. 1 and 2A.

The fourth semiconductor device 14 is a top semiconductor device. The fourth semiconductor device 14 may include a fourth semiconductor substrate 4100 and a fourth wiring layer 4200, and may not include a through via structure. The fourth connection terminal 4610 may be interposed between the fourth semiconductor device 14 and the third semiconductor device 13. The fourth semiconductor device 14 may be electrically connected to the first semiconductor device 11, the second semiconductor device 12, and the third semiconductor device 13 through a fourth connection terminal 4610. Alternatively, the package substrate 1000 may be electrically connected to the package substrate 1000. The fourth connection terminal 4610 may be substantially the same as or similar to the connection terminal 610 described with reference to FIGS. 1 and 2A.

The number of semiconductor devices 11, 12, 13 and 14 is not limited, but may be greater than four or less than four.

The molding film 5000 (molding layer) may be provided on the package substrate 1000 to cover the first to fourth semiconductor devices 11, 12, 13, and 14. The molding film 5000 may include an insulating polymer such as an epoxy-based molding compound.

According to example embodiments of the inventive concepts, an etch stop layer may be formed between the semiconductor substrate and the wiring pattern. Through-holes may be formed by the first etching process, the second etching process, and the third etching process to expose the wiring pattern. Since the formation of the through hole may be performed by the first to third etching processes, the etching of the through hole may be better controlled than conventional processes. Accordingly, unwanted etching of the wiring pattern and/or the separating layer can be prevented and/or suppressed.

While the inventive concepts have been particularly shown and described with reference to some example embodiments thereof, it will be understood that various changes in form and details may be made therein without departing from the spirit and scope of the following claims.

What is claimed is:

1. A semiconductor device comprising:
a crystalline substrate having a first surface and a second surface vertically opposite each other;
an insulating layer disposed on the first surface of the crystalline substrate;
an etch stop layer interposed between and contacting the crystalline substrate and the insulating layer;
a conductive through via structure penetrating the crystalline substrate and the insulating layer; and
an insulating separation layer disposed horizontally adjacent to the conductive through via structure, and having an inner wall and an outer wall opposite the inner wall, the inner wall contacting the conductive through via structure,
wherein the insulating separation layer includes a first portion disposed between the conductive through via structure and the crystalline substrate, and a second portion disposed between the conductive through via structure and the etch stop layer, and
wherein the outer wall of the second portion protrudes from the outer wall of the first portion horizontally relative to the conductive through via structure.

2. The semiconductor device of claim 1, wherein a first gap between the outer wall of the first portion and the conductive through via structure is smaller than a second gap between the outer wall of the second portion and the conductive through via structure.

3. The semiconductor device of claim 1, further comprising a wiring pattern disposed on a bottom surface of the insulating layer,
wherein the conductive through via structure is connected to the wiring pattern.

4. The semiconductor device of claim 3, wherein the wiring pattern includes a metal pattern and a barrier metal film, the barrier metal film being interposed between the metal pattern and the insulating layer.

5. The semiconductor device of claim 1, wherein the insulating separation layer surrounds the through via structure.

6. The semiconductor device of claim 1, further including transistors disposed in the crystalline substrate and/or on the first surface of the crystalline substrate.

7. The semiconductor device of claim 1, wherein a height of the conductive through via structure is 10 μm to 100 μm.

8. The semiconductor device of claim 1, wherein a lower surface of the insulating separation layer is disposed at the same level as or at a level higher than an upper surface of the insulating layer.

9. The semiconductor device of claim 1, wherein the etch stop layer includes a material different from the insulating layer.

10. A semiconductor device comprising:
a crystalline semiconductor substrate;
an etch stop layer disposed on a first surface of the crystalline semiconductor substrate;
a conductive through via structure penetrating the crystalline semiconductor substrate and the etch stop layer; and
an insulating separation layer disposed between the conductive through via structure and the crystalline semiconductor substrate,
wherein the insulating separation layer includes a first portion disposed between the conductive through via structure and the crystalline semiconductor substrate, and a second portion disposed between the conductive through via structure and the etch stop layer,
wherein the second portion is connected to the first portion, and
wherein the second portion protrudes toward and contacts a side surface of the etch stop layer.

11. The semiconductor device of claim 10, further comprising a wiring pattern disposed under the etch stop layer.

12. The semiconductor device of claim 11, further comprising an insulating layer disposed between the etch stop layer and the wiring pattern, and having an etch selectivity with respect to the etch stop layer,
wherein the conductive through via structure passes through the insulating layer.

13. The semiconductor device of claim 12, wherein, from a cross-sectional view, the insulating separation layer includes a first insulating isolation pattern disposed on a first sidewall of the conductive through via structure, and a second insulating isolation pattern disposed on a second sidewall of the conductive through via structure,
wherein the second sidewall is opposite to the first sidewall,
wherein the first insulating isolation pattern and the second insulating isolation pattern each includes a first isolation portion disposed between the conductive through via structure and the crystalline semiconductor substrate, and a second isolation portion disposed between the conductive through via structure and the etch stop layer and connected to the first isolation portion,
wherein the second isolation portion of the first insulating isolation pattern protrudes toward the first side wall of the etch stop layer, and
wherein the second isolation portion of the second insulating isolation pattern protrudes toward the second side wall of the etch stop layer.

14. The semiconductor device of claim 12, wherein a maximum width of the conductive through via structure in the insulating layer is less than a minimum width of the conductive through via structure in the crystalline semiconductor substrate.

15. The semiconductor device of claim 10, wherein the conductive through via structure has a height of 10 μm to 100 μm.

16. The semiconductor device of claim 10, further comprising:
a wiring layer including a plurality of insulating layers and a wiring structure on a bottom surface of the etch stop layer;
a connection terminal disposed under the wiring layer; and
a conductive pad disposed on an upper surface of the conductive through via structure,
wherein the conductive through via structure is electrically connected to the connection terminal.

17. A semiconductor device comprising:
a substrate;
a first semiconductor device disposed on the substrate; and
a second semiconductor device disposed on the first semiconductor device,
wherein the first semiconductor device comprises:
a first crystalline semiconductor substrate;

a first etch stop layer disposed on a first surface of the first crystalline semiconductor substrate;

a first conductive through via structure penetrating through the first crystalline semiconductor substrate and the first etch stop layer, and having a height of 10 µm to 100 µm; and a first insulating separation layer disposed between the first conductive through via structure and the first crystalline semiconductor substrate, wherein a lower portion of the first insulating separation layer contacts a portion of the first etch stop layer.

18. The semiconductor device of claim 17, wherein the second semiconductor device comprises:

a second crystalline semiconductor substrate;

a second etch stop layer disposed on the second crystalline semiconductor substrate;

a second conductive through via structure penetrating through the second crystalline semiconductor substrate and the second etch stop layer, and having a height of 10 µm to 100 µm; and a second insulating separation layer disposed between the second conductive through via structure and the second crystalline semiconductor substrate, and wherein the second insulating separation layer contacts a portion of the second etch stop layer.

19. The semiconductor device of claim 17, wherein the first insulating separation layer includes:

a first portion disposed between the first conductive through via structure and the first crystalline semiconductor substrate; and a second portion disposed between the first conductive through via structure and the first etch stop layer, and connected to the first portion, the second portion protruding toward a respective side surfaces of the first etch stop layer.

* * * * *